(12) United States Patent
Ishino

(10) Patent No.: US 11,329,088 B2
(45) Date of Patent: May 10, 2022

(54) SEMICONDUCTOR APPARATUS AND EQUIPMENT

(71) Applicant: CANON KABUSHIKI KAISHA, Tokyo (JP)

(72) Inventor: Hideaki Ishino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 119 days.

(21) Appl. No.: 16/855,197

(22) Filed: Apr. 22, 2020

(65) Prior Publication Data
US 2020/0343280 A1 Oct. 29, 2020

(30) Foreign Application Priority Data

Apr. 26, 2019 (JP) .............................. JP2019-086104

(51) Int. Cl.
| | |
|---|---|
| *H01L 23/48* | (2006.01) |
| *H01L 27/146* | (2006.01) |
| *H01L 23/544* | (2006.01) |
| *H01L 23/00* | (2006.01) |

(52) U.S. Cl.
CPC ........ *H01L 27/1463* (2013.01); *H01L 23/544* (2013.01); *H01L 27/14612* (2013.01); *H01L 27/14634* (2013.01); *H01L 27/14636* (2013.01); *H01L 27/14643* (2013.01); *H01L 27/14683* (2013.01); *H01L 24/48* (2013.01); *H01L 2223/54426* (2013.01); *H01L 2224/04042* (2013.01); *H01L 2224/08* (2013.01); *H01L 2224/08147* (2013.01); *H01L 2224/48463* (2013.01)

(58) Field of Classification Search
CPC .............................. H01L 23/488; H01L 23/52
See application file for complete search history.

(56) References Cited

U.S. PATENT DOCUMENTS

| | | | |
|---|---|---|---|
| 2010/0109006 A1* | 5/2010 | Kobayashi | ........ H01L 27/14636 257/48 |
| 2011/0186917 A1 | 8/2011 | Akiyama | |
| 2015/0249102 A1 | 9/2015 | Terada | |
| 2019/0165027 A1* | 5/2019 | Ishino | ............... H01L 27/14636 |

FOREIGN PATENT DOCUMENTS

| | | |
|---|---|---|
| JP | 2010109137 A | 5/2010 |
| JP | 2012099742 A | 5/2012 |
| WO | 2018235895 A1 | 12/2018 |

* cited by examiner

*Primary Examiner* — Jae Lee
(74) *Attorney, Agent, or Firm* — Venable LLP

(57) ABSTRACT

A semiconductor apparatus includes a semiconductor layer having first and second faces, a semiconductor element portion in which semiconductor elements are provided, and openings each penetrating the semiconductor layer from the second face side, an interconnection structure provided on the first face side, and an insulator portion provided to surround at least one of the openings within a virtual plane along the second face and extend to a depth between T/2 and T from the first face, where T is the thickness of the semiconductor layer. The semiconductor layer includes a semiconductor region of one conductivity type provided on the opposite side to the one opening to the insulator portion within the virtual plane, and a semiconductor region of another conductivity type provided in the semiconductor layer from the insulator portion face on the second face side to the second face in a direction perpendicular to the second face.

20 Claims, 19 Drawing Sheets

SEMICONDUCTOR APPARATUS AND EQUIPMENT

BACKGROUND OF THE INVENTION

Field of the Invention

The present invention relates to a semiconductor apparatus and a method of manufacturing the same.

Description of the Related Art

As one of the forms of an electrical connection between a semiconductor apparatus and an external component, there is a scheme in which an opening penetrating a semiconductor layer from the backside of the semiconductor layer and reaching an external connection electrode (pad electrode) is provided and an electrical connection to the external connection electrode exposed in the opening is formed by wire bonding or the like.

Japanese Patent Application Laid-Open No. 2010-109137 discloses a semiconductor apparatus in which an insulating structure formed of deep trench isolation (DTI) is provided around an opening that penetrates a semiconductor substrate and exposes an external connection electrode therein. With such an insulating structure being provided around the opening, an insulating state between a lead wiring and an internal element is ensured even if the lead wiring connected to an external connection electrode contacts with a sidewall of the opening, and the function of the semiconductor apparatus can be maintained.

However, the present inventor's intensive study of the insulating structure using the DTI described above has found that a defect or a crack of the semiconductor substrate occurs near the insulating structure. Further, it has been found that, if semiconductor apparatuses are manufactured with a defect or a crack of a semiconductor substrate existing, the fabrication yield is significantly reduced due to a foreign material caused by the defect or the crack.

SUMMARY OF THE INVENTION

The present invention intends to provide a semiconductor apparatus and a method of manufacturing the same that may ensure insulating performance of an opening used for an external connection electrode without reducing the fabrication yield.

According to one aspect of the present invention, provided is a semiconductor apparatus including a semiconductor layer having a first face and a second face opposite to the first face; and an interconnection structure provided on the first face side of the semiconductor layer, and an insulator portion arranged in a trench of the semiconductor layer, wherein the semiconductor layer is provided with a semiconductor element portion in which a plurality of semiconductor elements are provided, and the semiconductor layer is provided with a plurality of openings each penetrating the semiconductor layer, wherein the insulator portion is provided so as to surround at least one opening of the plurality of openings within a virtual plane along the second face, and the insulator portion extends to a depth in the semiconductor layer, the depth is larger than T/2 from the first face of the semiconductor layer, and the depth is smaller than T from the first face of the semiconductor layer, where T is a thickness of the semiconductor layer, wherein the semiconductor layer includes, a first semiconductor region of a first conductivity type provided on the opposite side to the one opening with respect to the insulator portion within the virtual plane, and a second semiconductor region of a second conductivity type provided in the semiconductor layer so as to extend from a face of the insulator portion on the second face side to the second face in a direction perpendicular to the second face.

According to another aspect of the present invention, provided is a method of manufacturing a semiconductor apparatus including forming a first trench and a second trench on a first face of a semiconductor substrate having the first face and a second face opposite to the first face, introducing an impurity into the semiconductor substrate in a bottom of the first trench to form a first semiconductor region and introducing an impurity into the semiconductor substrate in a bottom of the second trench to form a second semiconductor region, embedding an insulating material in the first trench to form a first insulator portion and embedding an insulating material in the second trench to form a second insulating portion, forming an interconnection structure on the first face of the semiconductor substrate, and thinning the semiconductor substrate from the second face of the semiconductor substrate to form a semiconductor layer from the semiconductor substrate, wherein in the forming the first trench and the second trench, a width of the second trench is wider than a width of the first trench, and a depth of the second trench is deeper than a depth of the first trench, and wherein in the thinning, the first semiconductor region and the second insulator portion are exposed on a face of the semiconductor layer on the opposite side to the interconnection structure side, and the depth of the first trench is larger than T/2 and smaller than T, where a thickness of the thinned semiconductor layer is T.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
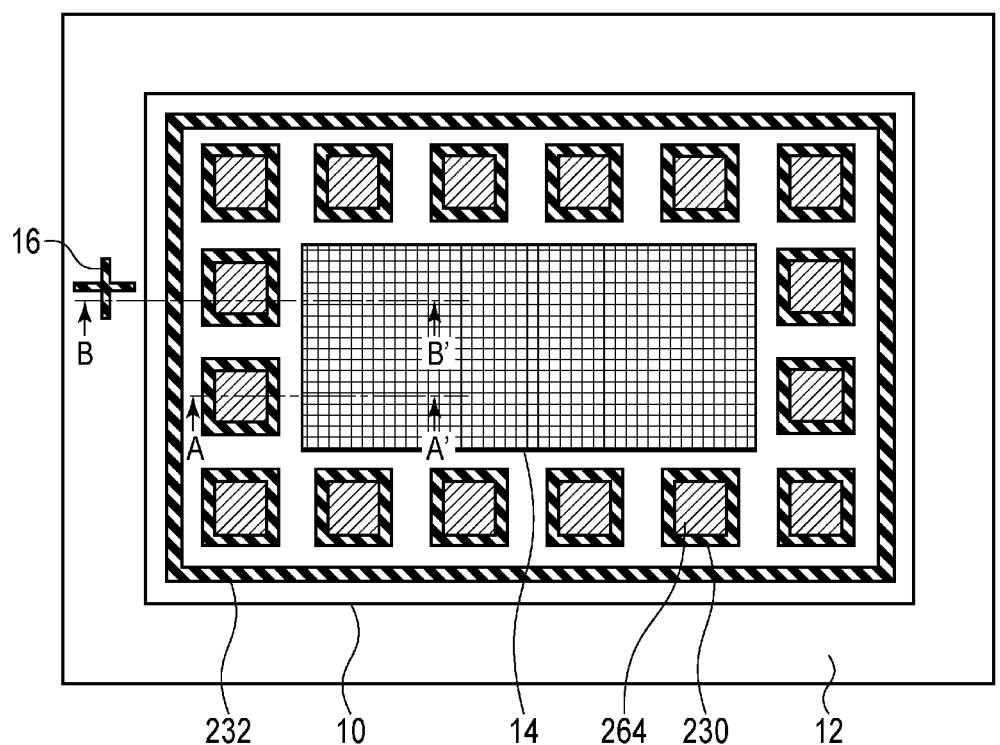
FIG. 1 is a top view of a semiconductor apparatus according to a first embodiment of the present invention.
Figure 2:
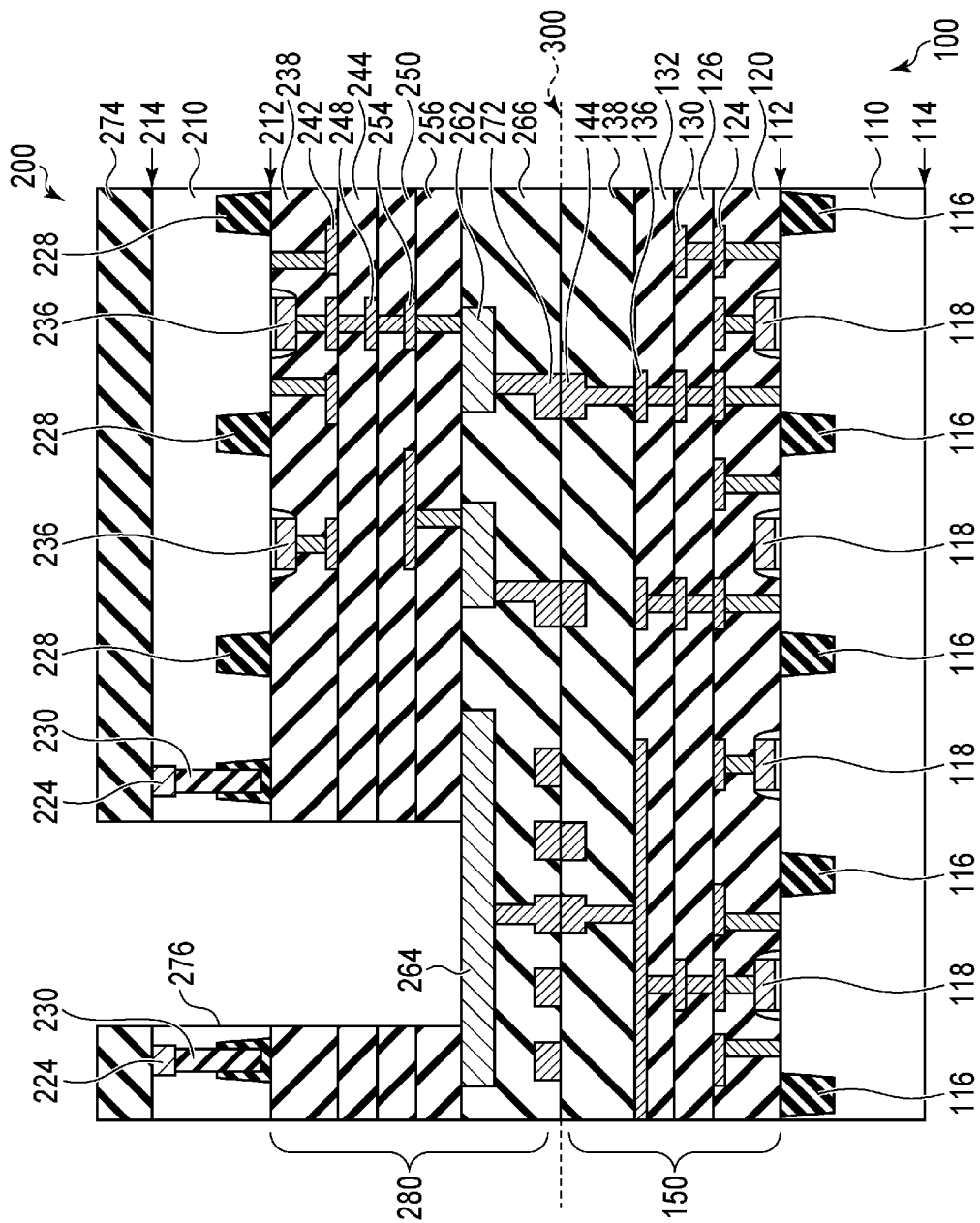
FIG. 2 is a schematic cross-sectional view of the semiconductor apparatus according to the first embodiment of the present invention.

A general configuration of a semiconductor apparatus according to a first embodiment of the present invention will be described with reference to FIG. 1 and FIG. 2. FIG. 1 is a top view of the semiconductor apparatus according to the present embodiment. FIG. 2 is a schematic cross-sectional view of the semiconductor apparatus according to the present embodiment. FIG. 2 is a cross-sectional view taken along the line A-A' of FIG. 1.

A plurality of semiconductor apparatuses according to the present embodiment are manufactured at the same time on a semiconductor wafer. FIG. 1 illustrates a top view of one of the plurality of semiconductor apparatuses arranged on a semiconductor wafer and the periphery thereof. On the semiconductor wafer, a plurality of semiconductor chip regions 10 corresponding to the plurality of semiconductor apparatuses are provided. A scribe region 12 that is a region used for cutting (dicing) the semiconductor wafer when the semiconductor apparatuses are diced into pieces is provided around each semiconductor chip region 10.

In the semiconductor chip region 10, a predetermined function block required for a semiconductor apparatus is provided. A solid-state imaging apparatus is assumed here as one example, and a pixel region in which a plurality of photoelectric conversion elements are arranged in a matrix is provided as a semiconductor element portion 14 at the center of the semiconductor chip region 10. A plurality of external connection electrodes 264 used for electrical connections between the semiconductor apparatus and an external apparatus are provided around the semiconductor element portion 14. Note that, although a solid-state imaging apparatus is illustrated here as an example of the semiconductor apparatus, a function included in the semiconductor apparatus is not particularly limited.

In the scribe region 12, various patterns used for management or the like of a manufacturing process are provided. As one example thereof, FIG. 1 illustrates an alignment mark 16 used for alignment of a reticle in a photolithography process.

A frame-shaped insulator portion 232 is provided along the circumference of the semiconductor chip region 10 in a plan view. Further, a frame-shaped insulator portion 230 is provided along the circumference of each of the external connection electrodes 264 in the plan view. The insulator portion 230 has a roll of improving insulation between a conductor member such as a wiring or an electrode connected to the external connection electrode 264 and an interconnection or an element inside the semiconductor apparatus. The conductor member connected to the external connection electrode 264 is not particularly limited and may be, for example, a connection member such as a bonding wire or a through electrode.

As illustrated in FIG. 2, for example, the semiconductor apparatus according to the present embodiment may include a first component 100 and a second component 200. For example, when the semiconductor apparatus is a solid-state imaging apparatus, a photoelectric conversion element may be provided on the second component 200 side, and a signal processing circuit or a control circuit may be provided on the first component 100 side. With such a configuration, suitable manufacturing processes can be applied to both a substrate forming an analog unit and a substrate forming a logic unit, respectively, and more preferable characteristics can be obtained. Note that the first component 100 is not necessarily required to have an element and may be a component having only the roll as a support substrate used for supporting the second component 200. Further, the first component 100 is not necessarily essential, and a semiconductor apparatus may be formed of only the second component 200. The first component 100 and the second component 200 of this example may be stacked on each other to form a chip. Such a semiconductor apparatus can be manufactured by forming a bonded wafer in which a wafer including the first component 100 and a wafer including the second component 200 are bonded and then dicing the joined wafer. Another manufacturing method may be a method of bonding a chip obtained by dicing a wafer including the first component 100 and a chip obtained by dicing a wafer including the second component 200.

The first component 100 includes a semiconductor layer 110 having a pair of a first face 112 and a second face 114 forming surfaces opposed to each other and an interconnection structure 150 provided on the first face 112 side of the semiconductor layer 110. Insulator portions 116 and MOS transistors having gate electrodes 118 are provided on the first face 112 of the semiconductor layer 110. The interconnection structure 150 includes interlayer insulating films 120, 126, 132, and 138 and interconnections 124, 130, 136, and 144 arranged therein. The MOS transistors, the interconnections 124, 130, 136, and 144, or the like are electrically connected via contact plugs or via-plugs arranged inside the interlayer insulating films 120, 126, 132, and 138.

The second component 200 includes a semiconductor layer 210 having a pair of a first face 212 and a second face 214 forming surfaces opposed to each other, an interconnection structure 280 provided on the first face 212 side of the semiconductor layer 210, and a structure 274 provided on the second face 214 side of the semiconductor layer 210. An insulator portion 228 and a MOS transistor having a gate electrode 236 are provided on the first face 212 of the semiconductor layer 210. The interconnection structure 280 includes interlayer insulating films 238, 244, 250, 256, and 266 and interconnections 242, 248, 254, 262, and 272 arranged therein. Further, the interconnection structure 280 further includes the external connection electrode 264 formed of the same layer as the interconnection 262. The MOS transistor, the interconnections 242, 248, 254, 262, and 272, the external connection electrode 264, or the like are electrically connected via contact plugs or via-plugs arranged inside the interlayer insulating films 238, 244, 250, 256, and 266. The structure 274 includes a predetermined structure in accordance with the function included in the semiconductor apparatus. For example, when a backside irradiation imaging apparatus is formed on the second component 200 side, the structure 274 may be an optical structure including a light-shielding layer, a color filter layer, a micro-lens layer, or the like. Note that the structure 274 is not necessarily required to be provided.

The first component 100 and the second component 200 are bonded to each other such that the face on the interlayer insulating film 138 side of the first component 100 faces the face on the interlayer insulating film 266 side of the second component 200. The interconnection 144 of the first component 100 and the interconnection 272 of the second component 200 are electrically connected in a junction plane 300 between the first component 100 and the second component 200.

In the structure 274, the semiconductor layer 210, and the interlayer insulating films 238, 244, 250, and 256 of the second component 200, an opening 276 that penetrates the structure 274, the semiconductor layer 210, and the interlayer insulating films 238, 244, 250, and 256 from the face opposite to the junction plane 300 interfacing with the first component 100 and reaches the external connection electrode 264 is provided. That is, the opening 276 penetrates the structure 274, the semiconductor layer 210, and a part of the interconnection structure 280 and exposes the external connection electrode 264 therein. Thereby, the wiring or the electrode can be electrically connected to the external connection electrode 264 via the opening 276.

Further, the insulator portion 230 is provided in the semiconductor layer 210 of the second component 200 so as to surround the opening 276 within a virtual plane along the second face 214. The insulator portion 230 is provided so as to surround at least one opening 276. That is, a plurality of openings 276 may be surrounded by one insulator portion 230, or each of a plurality of openings 276 may be surrounded by the insulator portion 230.

The insulator portion 230 reaches the first face 212 of the semiconductor layer 210 and is in contact with the semiconductor region 224 on the second face 214 side of the semiconductor layer 210. The semiconductor region 224 reaches the second face 214 of the semiconductor layer 210. In other words, the semiconductor region 224 is provided in the semiconductor layer 210 so as to extend from a face of the insulator portion 230 on the second face 214 side to the second face 214 in a direction perpendicular to the second face 214.

The semiconductor region 224 has the conductivity type opposite to a first region located on the opening 276 side with respect to the insulator portion 230 and a second region located on the opposite side to the opening 276 with respect to the insulator portion 230 within the virtual plane along the second face 214 in the semiconductor layer 210. The first region is a region between the opening 276 and the insulator portion 230 surrounding the opening 276. That is, the first region and the second region are electrically isolated from each other by the insulator portion 230 and the semiconductor region 224. Note that an insulating structure formed of an insulator embedded in a deep trench provided in a semiconductor layer, such as the insulator portion 230 of the present embodiment, may be referred to as deep trench isolation (DTI).

As described above, in the semiconductor apparatus of the present embodiment, the insulator portion 230 and the semiconductor region 224 are provided in the semiconductor layer 210 so as to surround the opening 276 that exposes the external connection electrode 264. Therefore, when a wiring is connected to the external connection electrode 264, even if the wiring contacts with the inner wall of the opening 276, the state of electrical insulation with another element or the like formed in the semiconductor layer 210 can be maintained by the insulator portion 230 and the semiconductor region 224. Further, since the insulator portion 230 does not reach the second face 214 of the semiconductor layer 210, a reduction of the mechanical strength of the semiconductor layer 210 due to the formation of the insulator portion 230 can be suppressed. Accordingly, for example, stress concentration in a process of thinning the semiconductor layer 210 can be reduced, and occurrence of a chipping, a crack, or the like can be suppressed.

Next, a method of manufacturing the semiconductor apparatus according to the present embodiment will be described with reference to FIG. 3A to FIG. 5C. FIG. 3A to FIG. 5C are cross-sectional views illustrating the method of manufacturing the semiconductor apparatus according to the present embodiment and correspond to the cross-sectional view taken along the line A-A' of FIG. 1.

First, the semiconductor layer 110 is prepared as the base material of the first component 100. The semiconductor layer 110 is a silicon substrate, for example, and has a pair of the first face 112 and the second face 114 forming surfaces opposed to each other.

Figure 3A:
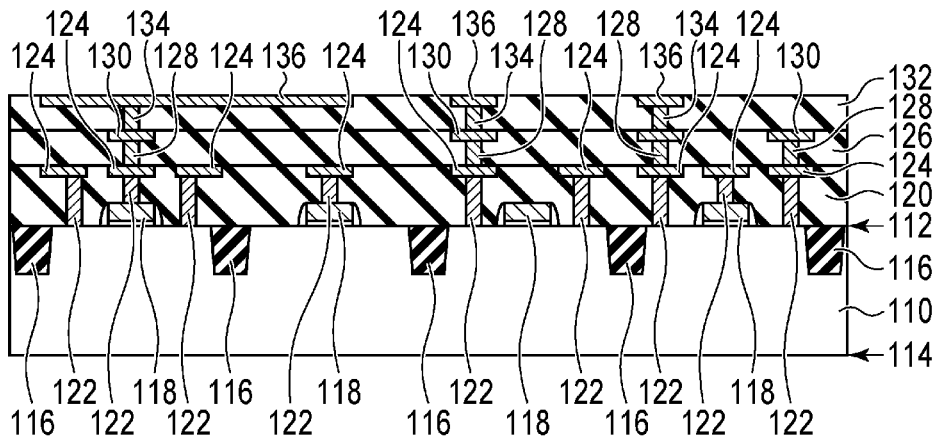
FIG. 3A, FIG. 3B, and FIG. 3C are cross-sectional views (part 1) illustrating a method of manufacturing the semiconductor apparatus according to the first embodiment of the present invention.

Next, the insulator portions 116, MOS transistors including the gate electrodes 118, the interlayer insulating film 120, contact plugs 122, and the interconnections 124 are formed on the first face 112 side of the semiconductor layer 110 by a known manufacturing process for semiconductor apparatuses. Furthermore, the interlayer insulating film 126, the interconnections 130, and via plugs 128 connecting the interconnections 124 and the interconnections 130 to each other are formed on the interlayer insulating film 120. Furthermore, the interlayer insulating film 132, the interconnections 136, and via plugs 134 connecting the interconnections 130 and the interconnections 136 to each other are formed on the interlayer insulating film 126 (FIG. 3A). The via plug 128 and the interconnection 130 may be integrally formed, and the via plug 134 and the interconnection 136 may be integrally formed.

Note that, although the configuration including three interconnection layers is described here as one example, any number of interconnection layers can be selected. Further, although only the MOS transistor is depicted as an element forming the semiconductor layer 110, other elements such as a MOS capacitor, a trench capacitor, a resistor element using a diffusion layer or a gate layer, or the like can be arranged. Further, a MIM capacitor or the like can be arranged between interconnection layers.

Further, for the material forming each component, any material can be selected from materials that are generally used. For example, polysilicon single-layer structure, polycide structure, a polymetal structure, or the like can be applied for the gate electrode 118, for example. For example, tungsten together with titanium nitride of a barrier metal can be applied for the contact plug 122. For example, a silicon oxide film, a silicon nitride film, a silicon oxy-nitride film, a silicon oxide film containing carbon, a silicon oxide film containing fluorine, or the like can be applied for the interlayer insulating films 120, 126, and 132. Each of the interlayer insulating films 120, 126, and 132 may be of single-layer structure or layered structure combining the materials described above. A conductive material whose primary material is a metal such as aluminum or copper can be applied for the interconnections 124, 130, and 136 and the via plugs 128 and 134.

Next, an insulating film is deposited on the interlayer insulating film 132 by a CVD method, for example, to form the interlayer insulating film 138. For the interlayer insulating film 138, a silicon oxide film, a silicon nitride film, a silicon oxy-nitride film, a silicon oxide film containing carbon, a silicon oxide film containing fluorine, or the like can be applied as with the interlayer insulating films 120, 126, and 132. The interlayer insulating film 138 may be of single-layer structure or layered structure combining the insulating materials described above.

Figure 3B:
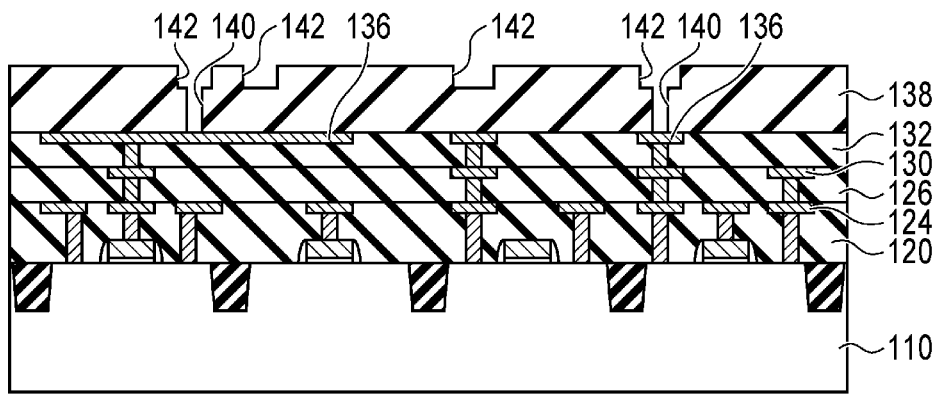

Next, in the interlayer insulating film 138, via holes 140 reaching the interconnection 136 and interconnection trenches 142 provided on the surface of the interlayer insulating film 138 and communicating with the via holes 140 are formed by using a dual damascene process, for example (FIG. 3B).

Note that a plurality of interconnection trenches 142 are arranged in a region overlapping the external connection electrode 264 in a plan view when the first component 100 is bonded to the second component 200 and are also arranged in another region. In this case, the interconnection trenches 142 are arranged in the region overlapping the external connection electrode 264 and in another region at respective appropriate densities.

Next, a conductive film whose primary material is copper, for example, is formed over the whole surface on the interlayer insulating film 138 side including the inside of the via holes 140 and the inside of the interconnection trenches 142 by using a sputtering method, a CVD method, a plating method, or the like, for example.

Figure 3C:
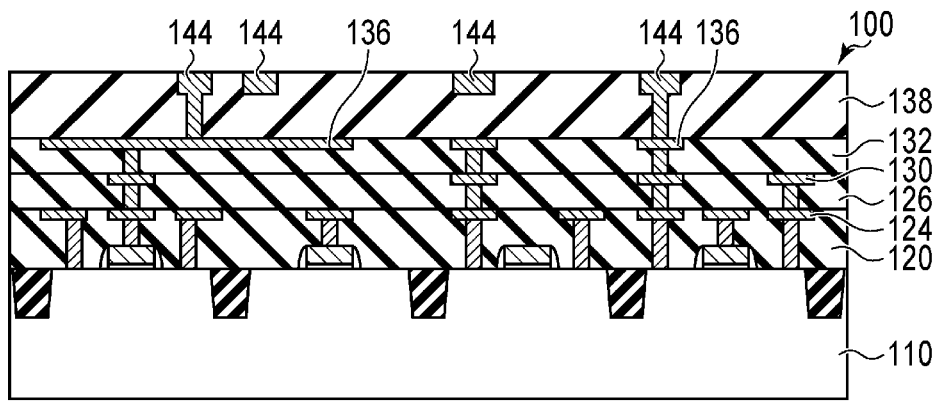

Next, the conductive film on the interlayer insulating film 138 is removed by a chemical mechanical polishing (CMP) method to form the interconnections 144 each including a via portion formed of a conductive film embedded in the via hole 140 and an interconnection portion formed of a conductive film embedded in the interconnection trench 142 (FIG. 3C). In such a way, the first component 100 before bonded is completed.

Further, the semiconductor layer 210 is prepared as the base material of the second component 200 independently of the first component 100. The semiconductor layer 210 is a silicon substrate, for example, and has the first face 212 and the second face 214 that are a pair of opposed surfaces. While the conductivity type of the semiconductor layer 210 may be any of the n-type or the p-type, the n-type semiconductor layer 210 is assumed here for illustration.

Next, an insulating film 216 having a film thickness of around 0.5 μm to 1.0 μm, for example, is formed on the first face 212 of the semiconductor layer 210 by a CVD method, for example. For the material forming the insulating film 216, any insulating material can be selected from materials that are generally used for semiconductor apparatuses. For example, a silicon oxide film, a silicon nitride film, or the like can be applied for the insulating film 216. The insulating film 216 may be of single-layer structure or layered structure combining the insulating materials described above.

Figure 4A:
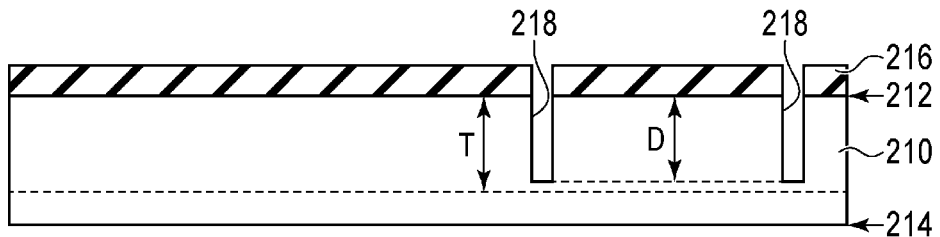
FIG. 4A, FIG. 4B, FIG. 4C, FIG. 4D, FIG. 4E, FIG. 4F, FIG. 4G, FIG. 4H, FIG. 4I, and FIG. 4J are cross-sectional views (part 2) illustrating the method of manufacturing the semiconductor apparatus according to the first embodiment of the present invention.

Next, the insulating film 216 and the semiconductor layer 210 are patterned by using photolithography and dry etching to form the trench 218 in the insulating film 216 and the semiconductor layer 210 (FIG. 4A). The trench 218 is provided in a frame-shaped region along the circumference of a region in which the external connection electrode 264 is to be provided in the later process.

Herein, the depth D of the trench 218 from the first face 212 is set in a range of T/2<D<T, where the thickness of the thinned semiconductor layer 210 is T. For example, when the thickness T of the thinned semiconductor layer 210 is 3.0 μm, the depth D of the trench 218 can be set to around 2.6 μm.

Figure 4B:
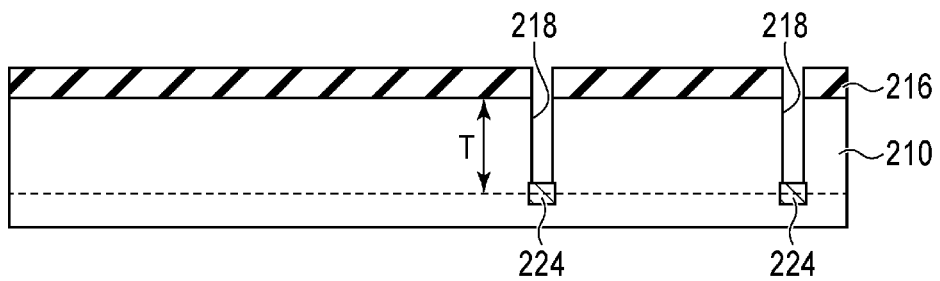

Next, the insulating film 216 is used as a mask to introduce an impurity to the semiconductor layer 210 by ion implantation and form the semiconductor region 224 of the conductivity type opposite to the semiconductor layer 210 inside the semiconductor layer 210 on the bottom of the trench 218 provided in the semiconductor layer 210 (FIG. 4B). In the present embodiment, since the semiconductor layer 210 is assumed to be of the n-type, the semiconductor region 224 is of the p-type. The semiconductor region 224 reaches at least the depth corresponding to the thickness T of the thinned semiconductor layer 210. When the thickness T of the thinned semiconductor layer 210 is 3.0 μm and the depth D of the trench 218 is 2.6 μm, the width in the depth direction of the semiconductor region 224 can be set to around 0.4 μm to 0.7 μm, for example.

Figure 4C:
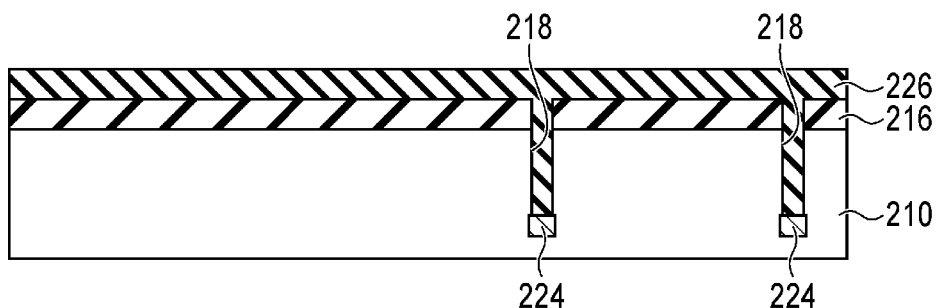

Next, an insulating film 226 is formed on the whole surface on the insulating film 216 side including the inside of the trench 218 by a CVD method, for example (FIG. 4C). For the material forming the insulating film 226, any material can be selected from insulating materials that are generally used for semiconductor apparatuses. For example, a silicon oxide film, a silicon nitride film, a silicon oxy-nitride film, or the like can be applied for the insulating film 226.

Figure 4D:
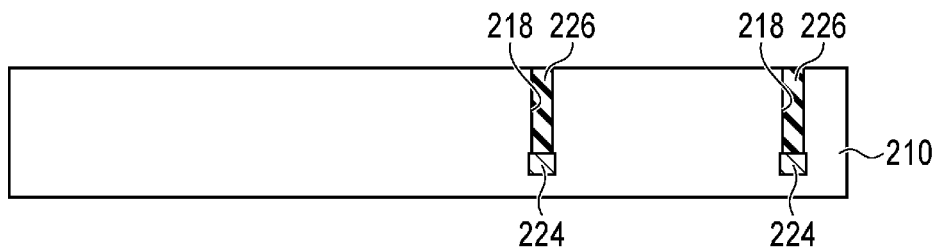

Next, the insulating film 226 on the insulating film 216 and the insulating film 216 are sequentially removed so that at least the insulating film 226 embedded in the trench 218 of the semiconductor layer 210 remains (FIG. 4D). A CMP method, wet etching, dry etching, or the like can be applied for the removal of the insulating film 226 and the insulating film 216.

Figure 4E:
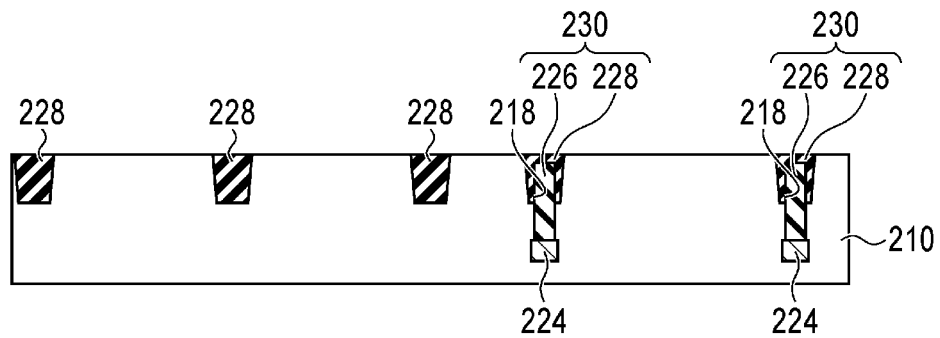

Next, the insulator portion 228 is formed on the surface of the semiconductor layer 210 on the first face 212 side by a shallow trench isolation (STI) method or the like, for example. The insulator portion 228 is formed in a region overlapping the trench 218 in a plan view in addition to forming an element isolation portion that defines an active region in the first face 212 of the semiconductor layer 210. Thereby, the insulator portion 230 formed of the insulating film 226 and the insulator portion 228 is formed in a portion in which the trench 218 is provided (FIG. 4E). Note that the typical thickness in the depth direction of the insulator portion 228 formed by the STI method is smaller than or equal to T/2, where the thickness of the thinned semiconductor layer 210 is T.

Figure 4F:
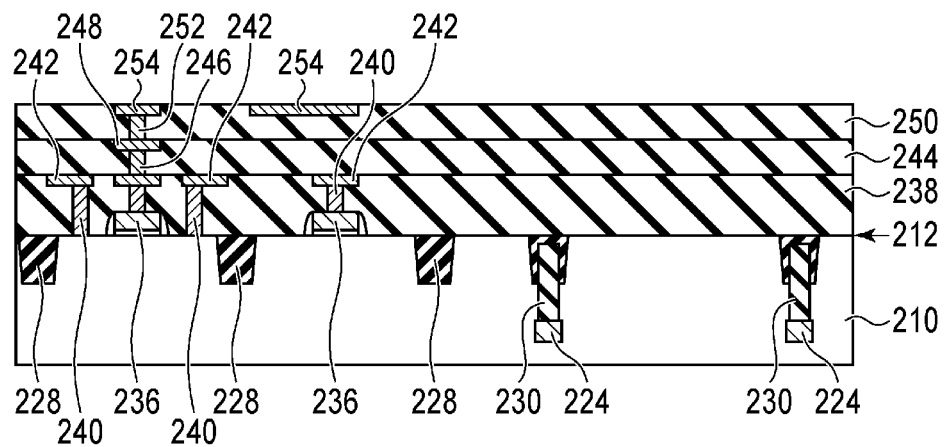

Next, MOS transistors including the gate electrodes 236, the interlayer insulating film 238, contact plugs 240, and the interconnections 242 are formed by a known manufacturing process for semiconductor apparatuses on the first face 212 side of the semiconductor layer 210 in which the insulator portion 230 is formed. Furthermore, the interlayer insulating film 244, the interconnection 248, and a via plug 246 connecting the interconnection 242 and the interconnection 248 to each other are formed on the interlayer insulating film 238. Furthermore, the interlayer insulating film 250, the interconnection 254, and a via plug 252 connecting the interconnection 248 and the interconnection 254 to each other are formed on the interlayer insulating film 244 (FIG. 4F). The via plug 246 and the interconnection 248 may be integrally formed, and the via plug 252 and the interconnection 254 may be integrally formed.

Note that, although the configuration including three interconnection layers is described here as one example, any number of interconnection layers can be selected. Further, although only the MOS transistor is depicted as an element forming the semiconductor layer 210, other elements such as a photodiode, a capacitor, a resistor element, or the like can be arranged.

Further, for the material forming each component, any material can be selected from materials that are generally used. For example, polysilicon single-layer structure, polycide structure, a polymetal structure, or the like can be applied for the gate electrode 236, for example. For example, tungsten together with titanium nitride of a barrier metal can be applied for the contact plug 240. For example, a silicon oxide film, a silicon nitride film, a silicon oxy-nitride film, a silicon oxide film containing carbon, a silicon oxide film containing fluorine, or the like can be applied for the interlayer insulating films 238, 244, and 250. Each of the interlayer insulating films 238, 244, and 250 may be of single-layer structure or layered structure combining the materials described above. A conductive material whose primary material is a metal such as aluminum or copper can be applied for the interconnections 242, 248, and 254 and the via plugs 246 and 252.

Next, an insulating film is deposited on the interlayer insulating film 250 by a CVD method, for example, to form the interlayer insulating film 256. For the interlayer insulating film 256, a silicon oxide film, a silicon nitride film, a silicon oxy-nitride film, a silicon oxide film containing carbon, a silicon oxide film containing fluorine, or the like can be applied as with the interlayer insulating films 238, 244, and 250. The interlayer insulating film 256 may be of single-layer structure or layered structure combining the insulating materials described above.

Next, the interlayer insulating film 256 is patterned by using photolithography and dry etching, and via holes 258 in which via plugs 260 are to be embedded are formed in the interlayer insulating film 256.

Next, a conductive film is deposited over the whole surface on the interlayer insulating film 256 side including the inside of the via holes 258 by a CVD method, a sputtering method, or the like, for example. Stacked films of a titanium nitride film as a barrier metal and a tungsten film can be applied for this conductive film.

Figure 4G:
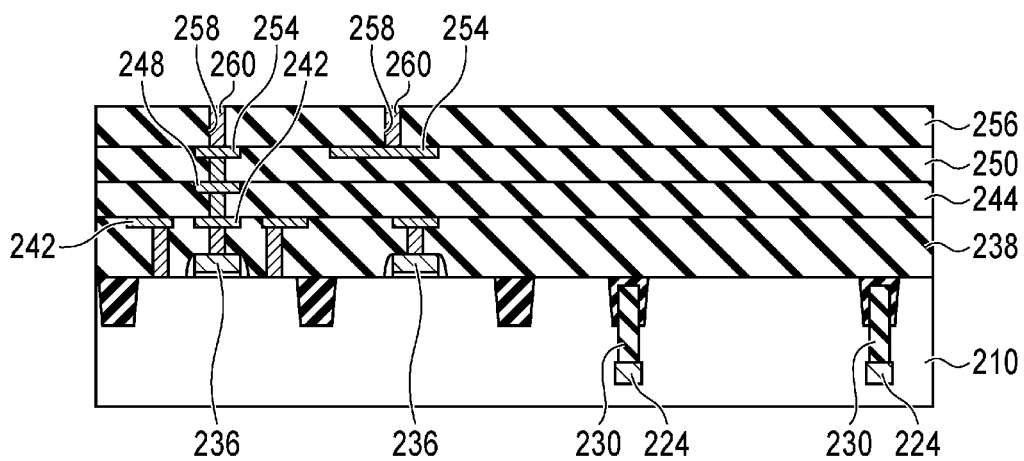

Next, the conductive film on the interlayer insulating film 256 is removed by a CMP method, etch back, or the like to form the via plugs 260 embedded in the via holes 258 (FIG. 4G).

Next, a conductive film is deposited on the interlayer insulating film 256 in which the via plugs 260 have been embedded by a sputtering method, for example. A metal material whose primary material is aluminum can be applied for this conductive film.

Figure 4H:
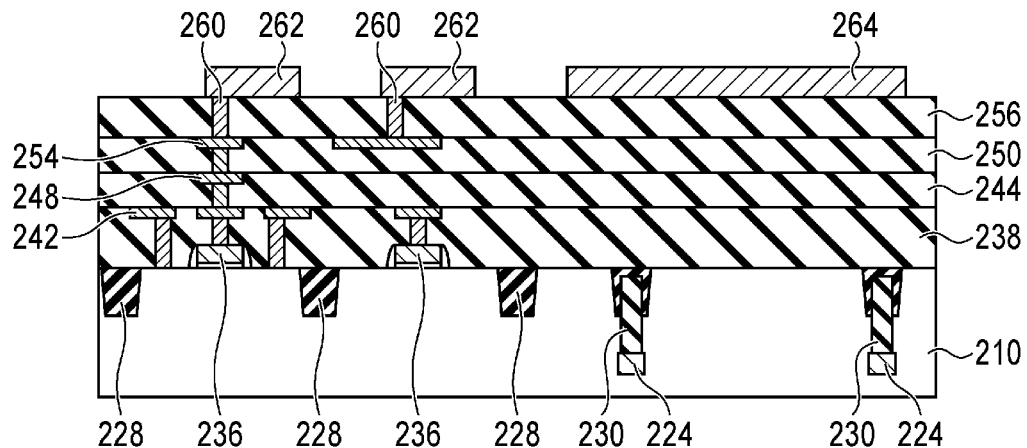

Next, the conductive film on the interlayer insulating film 256 is patterned by photolithography and dry etching to form the interconnections 262 and the external connection electrode 264 formed of this conductive film (FIG. 4H). As illustrated in FIG. 1, the region in which the external connection electrode 264 is provided includes a region surrounded by the frame-shaped insulator portion 230 in a plan view.

Next, an insulating film is deposited over the whole surface on the interlayer insulating film 256 side by a CVD method, for example, to form the interlayer insulating film 266 so as to cover the interconnections 262 and the external connection electrode 264. For the interlayer insulating film 266, a silicon oxide film, a silicon nitride film, a silicon oxy-nitride film, a silicon oxide film containing carbon, a silicon oxide film containing fluorine, or the like can be applied as with the interlayer insulating films 238, 244, 250, and 256. The interlayer insulating film 266 may be of single-layer structure or layered structure combining the materials described above. For example, after deposition of a silicon oxide film, the surface of the silicon oxide film is planarized by a CMP method, and a silicon nitride film is deposited on the planarized silicon oxide film. Thereby, the interlayer insulating film 266 having two-layer structure of the silicon oxide film and the silicon nitride film and having the planarized surface is formed.

Figure 4I:
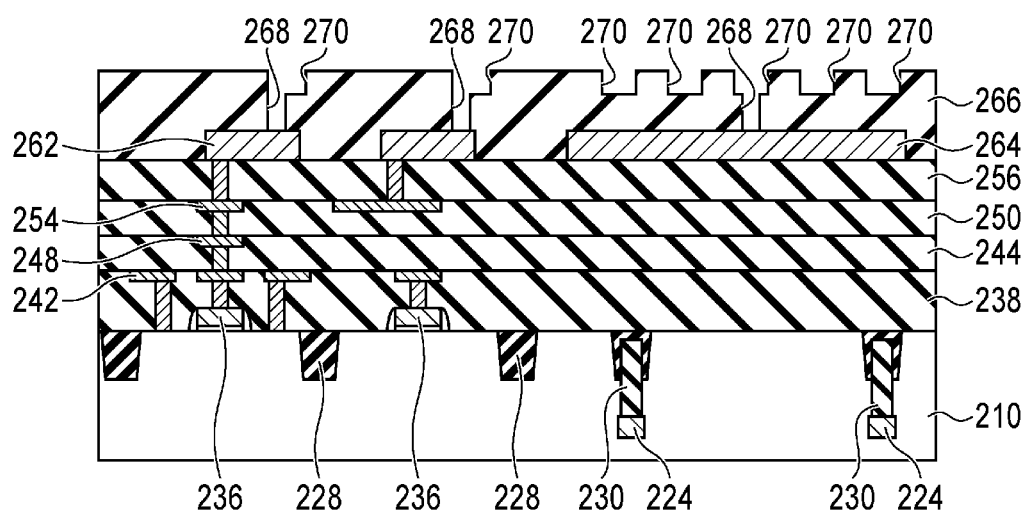

Next, in the interlayer insulating film 266, via holes 268 reaching the interconnection 262 or the external connection electrode 264 and interconnection trenches 270 provided on the surface of the interlayer insulating film 266 and communicating with the via holes 268 are formed by using a dual damascene process, for example (FIG. 4I).

Next, a conductive film whose primary material is copper, for example, is formed over the whole surface on the interlayer insulating film 266 side including the inside of the via holes 268 and the inside of the interconnection trenches 270 by using a sputtering method, a CVD method, a plating method, or the like, for example.

Figure 4J:
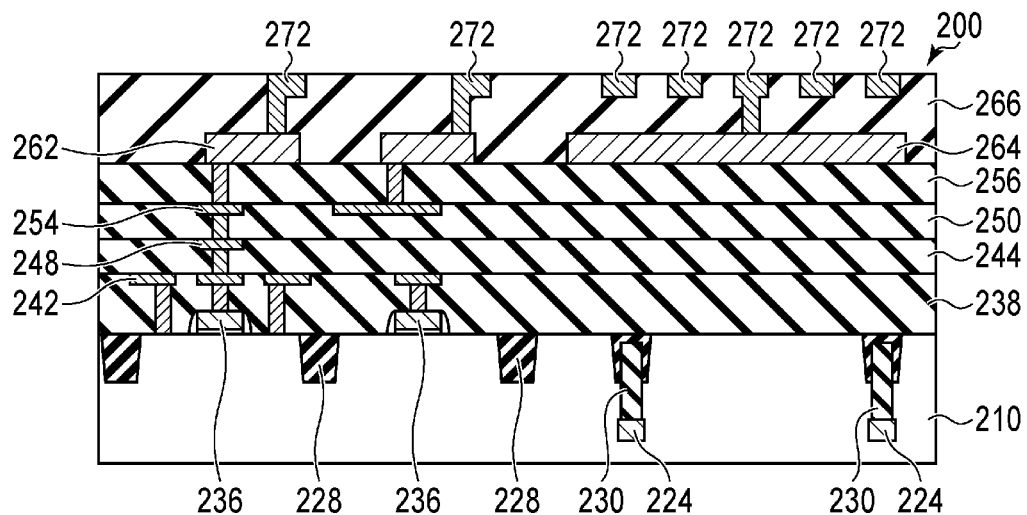

Next, the conductive film on the interlayer insulating film 266 is removed by a CMP method to form the interconnections 272 each including a via portion formed of a conductive film embedded in the via hole 268 and an interconnection portion formed of a conductive film embedded in the interconnection trench 270 (FIG. 4J). In such a way, the second component 200 before bonded is completed.

Next, the first component 100 and the second component 200 as formed described above are arranged so that the face on the interlayer insulating film 138 side faces the face on the interlayer insulating film 266 side and are bonded. Thereby, the interconnection 144 of the first component 100 and the interconnection 272 of the second component 200 are electrically connected at the junction plane 300 between the first component 100 and the second component 200.

Figure 5A:
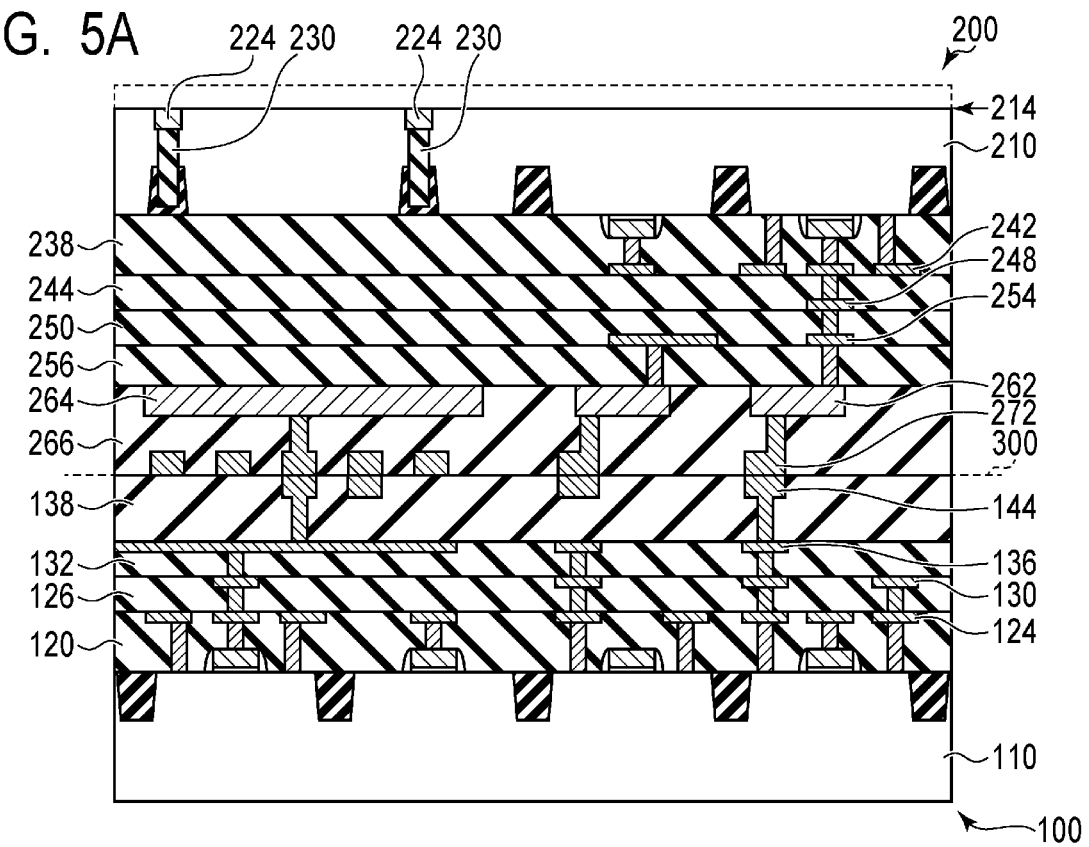
FIG. 5A, FIG. 5B, and FIG. 5C are cross-sectional views (part 3) illustrating the method of manufacturing the semiconductor apparatus according to the first embodiment of the present invention.

Next, the semiconductor layer 210 of the second component 200 is thinned to the degree that the semiconductor region 224 is exposed and remains on the second face 214 side (FIG. 5A). The thickness of the thinned semiconductor layer 210 is the thickness T described above. A method such as back grind, CMP, etching, or the like can be applied for the thinning of the semiconductor layer 210. In the following description, for convenience, a new surface exposed by thinning the semiconductor layer 210 from the second face 214 side is also referred to as the second face 214 of the semiconductor layer 210.

At this time, since the trench 218 (depth D) provided in the semiconductor layer 210 is shallower than the thickness T of the thinned semiconductor layer 210, the trench 218, that is, the insulator portion 230 would not be exposed on the second face 214 side of the semiconductor layer 210. Therefore, local stress concentration in a process of thinning the semiconductor layer 210 can be suppressed, and occurrence of a chipping or a crack can be prevented.

Next, the structure 274 predetermined in accordance with the function included in the semiconductor apparatus is formed, if necessary, on the second face 214 of the semiconductor layer 210. For example, when a backside irradiation imaging apparatus is formed on the second component 200 side, the structure 274 may include a light-shielding layer, a color filter layer, a micro-lens layer, or the like. For the material forming the structure 274, any material can be selected from insulating materials that are generally used for semiconductor apparatuses. For example, a silicon oxide film, a silicon nitride film, a silicon oxy-nitride film, a silicon oxide film containing carbon, a silicon oxide film containing fluorine, an organic insulating film, or the like can be applied for an insulating material. Each of these insulating materials may be of single-layer structure or layered structure. Further, AlCu, W, TiN, or the like can be applied for a conductive material.

Figure 5B:
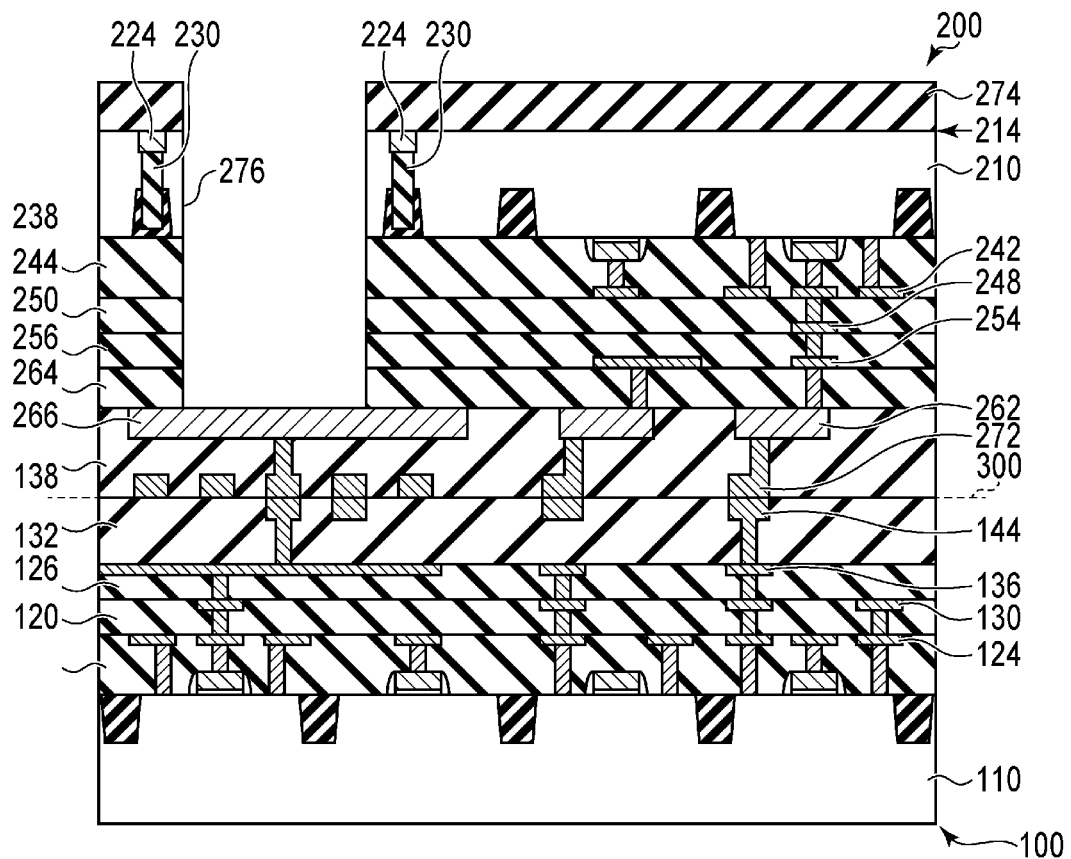

Next, the structure 274, the semiconductor layer 210, and the interlayer insulating films 238, 244, 250, and 256 are patterned by using photolithography and dry etching. Thereby, the opening 276 penetrating the structure 274, the semiconductor layer 210, and the interlayer insulating films 238, 244, 250, and 256 and reaching the external connection electrode 264 is formed in the second component 200 (FIG. 5B).

After a series of wafer processes is completed in such a way, the bonded body of the first component 100 and the second component 200 is diced and divided into individual semiconductor chips.

Next, each of the plurality of semiconductor chips diced into pieces is bonded to a support member (not illustrated) such as a package substrate or a lead frame.

Figure 5C:
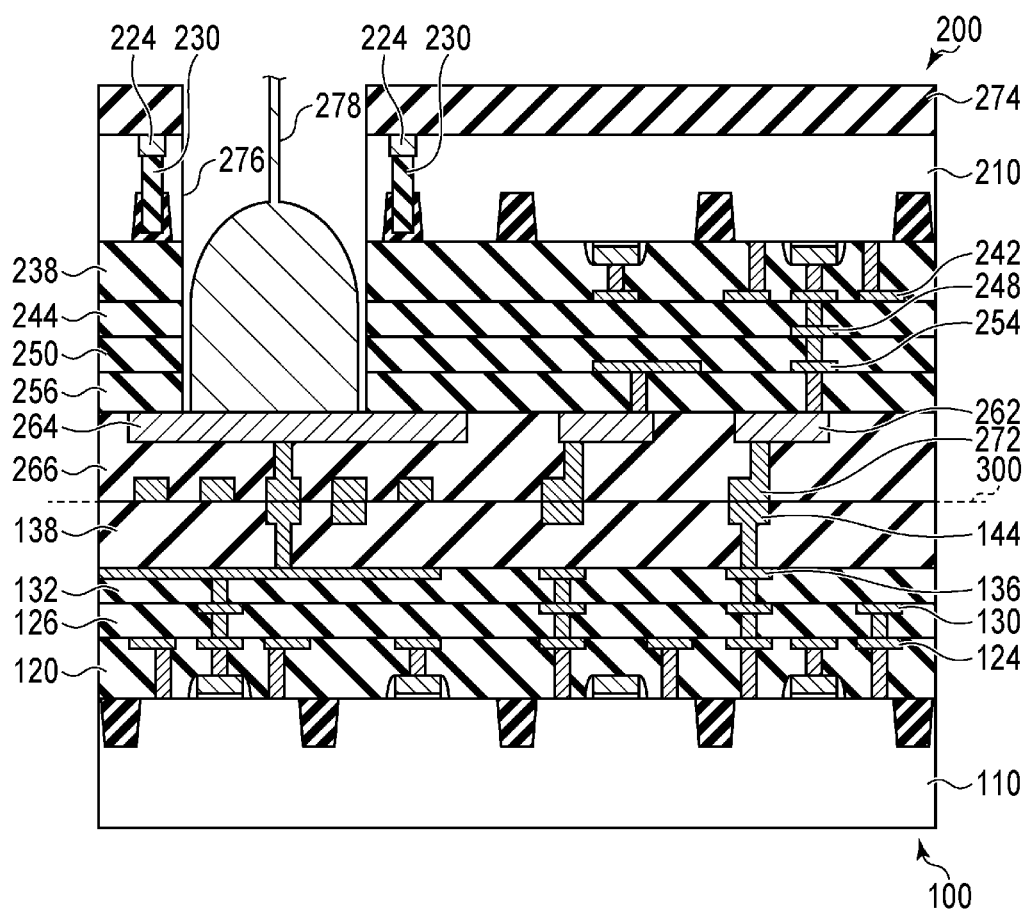

Next, the external connection electrode 264 exposed in the opening 276 and an external terminal provided on the support member are connected to each other by a wire 278 by wire bonding, and the semiconductor apparatus according to the present embodiment is completed (FIG. 5C).

As described above, in the present embodiment, the semiconductor region 224 of a different conductivity type from the semiconductor layer 210 is connected to the insulator portion 230 surrounding the opening 276 exposing the external connection electrode 264, and thereby insulation of the opening 276 is ensured. Therefore, according to the present embodiment, it is possible to avoid stress concentration in the insulator portion 230 in a substrate thinning process and prevent a defect or a crack of the semiconductor layer 210. Accordingly, it is possible to ensure insulation performance of the opening 276 used for the external connection electrode 264 without reducing the fabrication yield of semiconductor apparatuses.

Second Embodiment

A semiconductor apparatus and a method of manufacturing the same according to a second embodiment of the present invention will be described with reference to FIG. 6 to FIG. 7J. The same components as those of the semiconductor apparatus according to the first embodiment are labeled with the same references, and the description thereof will be omitted or simplified.

First, a general configuration of the semiconductor apparatus according to the present embodiment will be described with reference to FIG. 6. FIG. 6 is a schematic cross-sectional view of the semiconductor apparatus according to the present embodiment. FIG. 6 is a cross-sectional view taken along the line B-B' of FIG. 1.

Figure 6:
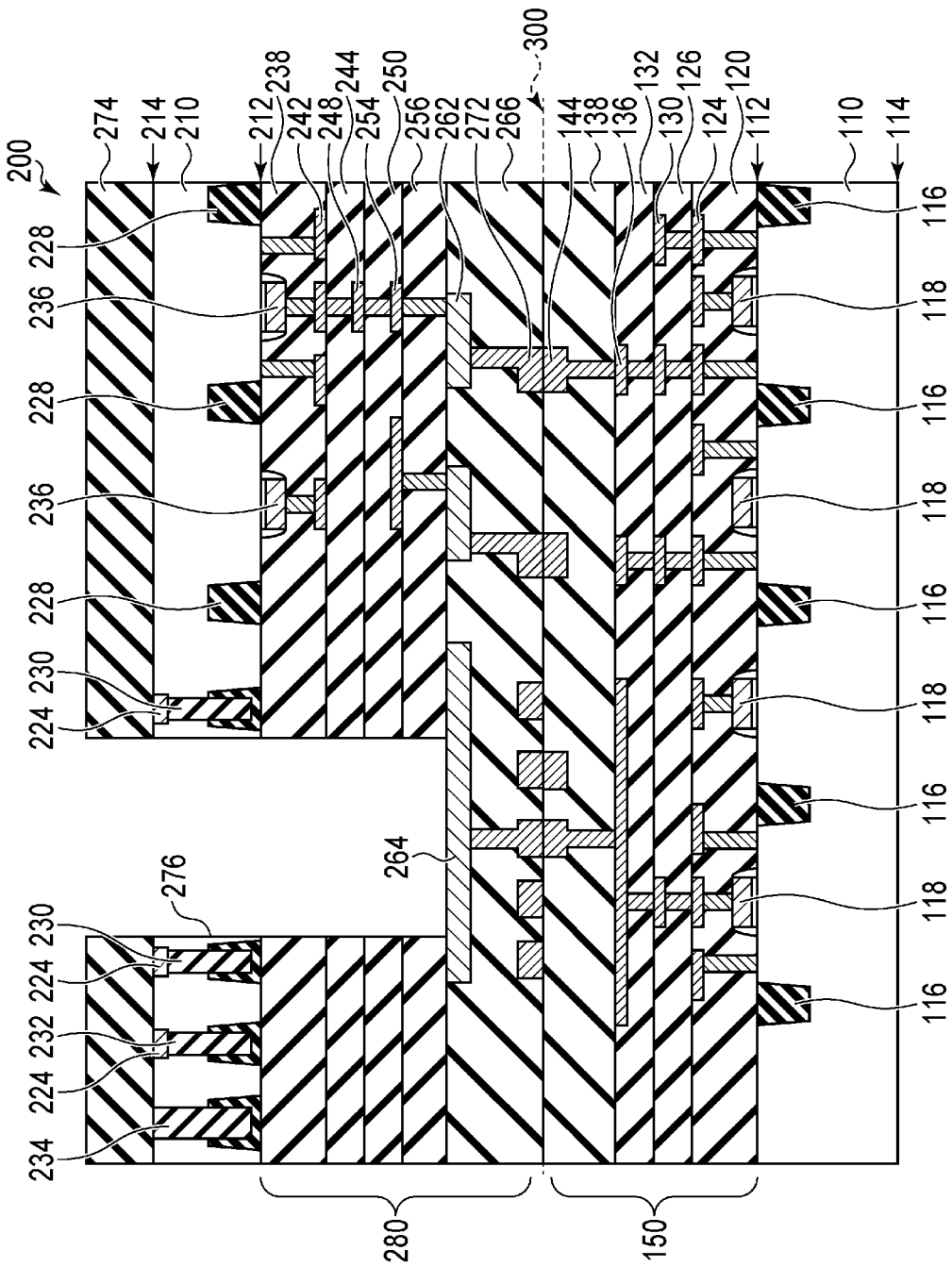
FIG. 6 is a schematic cross-sectional view of a semiconductor apparatus according to a second embodiment of the present invention.

As illustrated in FIG. 6, in the semiconductor apparatus according to the present embodiment, the frame-shaped insulator portion 232 provided along the circumference of the semiconductor chip region 10 has the same structure as the insulator portion 230 surrounding the opening 276. Further, the alignment mark 16 is formed of an insulator member 234 provided so as to penetrate the semiconductor layer 210. Other features are the same as those of the semiconductor apparatus according to the first embodiment. Note that the width of the insulator member 234 at the depth of T/2 of the semiconductor layer 210 from the first face 212 is wider than each width of the insulator portions 230 and 232 at the depth of T/2 of the semiconductor layer 210 from the first face 212. It can be said in a broad sense that the insulator portion 232 in the present embodiment is an insulator portion provided so as to surround at least one opening 276 of the plurality of openings 276 as with the insulator portion 230. The insulator portion 232 is located between the end face of the semiconductor layer 210 and the insulator portion 230.

Next, the method of manufacturing the semiconductor apparatus according to the present embodiment will be described with reference to FIG. 7A to FIG. 7J. FIG. 7A to FIG. 7J are cross-sectional views illustrating the method of manufacturing the semiconductor apparatus according to the present embodiment.

First, the first component 100 before bonded is manufactured in the same manner as in the manufacturing method of the first embodiment illustrated in FIG. 3A to FIG. 3C.

Further, the semiconductor layer 210 is prepared as the base material of the second component 200 independently of the first component 100. The semiconductor layer 210 is a silicon substrate, for example, and has the first face 212 and the second face 214 that are a pair of opposed surfaces. While the conductivity type of the semiconductor layer 210 may be any of the n-type or the p-type, the n-type semiconductor layer 210 is assumed here for illustration.

Next, the insulating film 216 having a film thickness of around 0.5 µm to 1.0 µm, for example, is formed on the first face 212 of the semiconductor layer 210 by a CVD method, for example. For the material forming the insulating film 216, any material can be selected from insulating materials that are generally used for semiconductor apparatuses. For example, a silicon oxide film, a silicon nitride film, or the like can be applied for the insulating film 216. The insulating film 216 may be of single-layer structure or layered structure combining the materials described above.

Figure 7A:
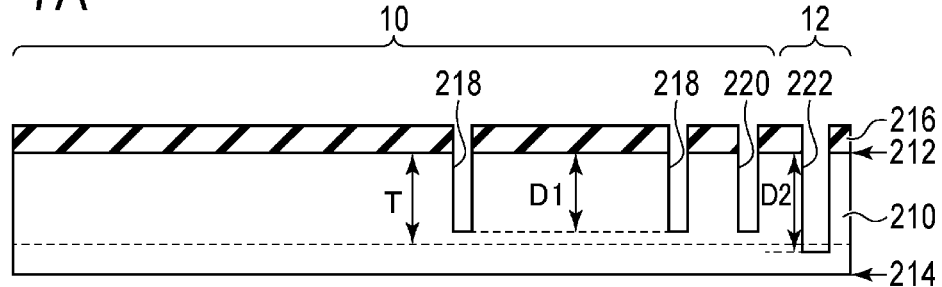
FIG. 7A, FIG. 7B, FIG. 7C, FIG. 7D, FIG. 7E, FIG. 7F, FIG. 7G, FIG. 7H, FIG. 7I, and FIG. 7J are cross-sectional views illustrating a method of manufacturing the semiconductor apparatus according to the second embodiment of the present invention.

Next, the insulating film 216 and the semiconductor layer 210 are patterned by using photolithography and dry etching to form trenches 218, 220, and 222 in the insulating film 216 and the semiconductor layer 210 (FIG. 7A). The trench 218 is provided in a frame-shaped region along the circumference of a region in which the external connection electrode 264 is to be provided in the later process. The trench 220 is provided in a frame-shaped region along the circumference of the semiconductor chip region 10. The trench 222 is a trench used for forming the alignment mark 16 and is provided in the scribe region 12.

Herein, the depth D1 of the trenches 218 and 220 from the first face 212 is set in a range of $T/2<D1<T$, where the thickness of the thinned semiconductor layer 210 is T. It is more preferable to set the depth D1 in a range of $T\times\frac{3}{4} \leq D1<T$. Further, the depth D2 of the trench 222 from the first face 212 is set in a range of $T \leq D2$. For example, when the thickness T of the thinned semiconductor layer 210 is 3.0 µm, the depth D1 of the trenches 218 and 220 can be set to around 2.6 µm, and the depth D2 of the trench 222 can be set to around 3.0 µm or larger.

Although the trenches 218 and 220 and the trench 222 having different depths may be individually formed, these trenches can be formed at the same time by using a micro-loading effect during dry etching, for example. That is, with the width of the trench 222 being set wider than each width of the trenches 218 and 220, the etching rate of the portion of the trench 222 can be higher than the etching rate of the portions of the trenches 218 and 220 due to a micro-loading effect during dry etching. Therefore, by appropriately setting the width of the trench 222 and each width of the trenches 218 and 220 in accordance with etching conditions, respectively, it is possible to set the depth D1 of the trenches 218 and 220 and the depth D2 of the trench 222 to meet the relationship described above.

Figure 7B:
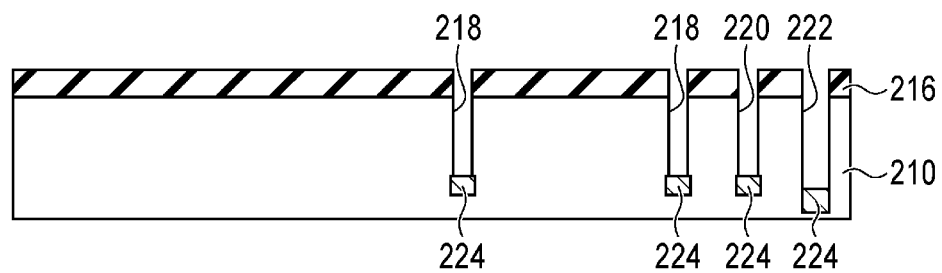

Next, the insulating film 216 is used as a mask to introduce an impurity to the semiconductor layer 210 by ion implantation and form the semiconductor region 224 of the conductivity type opposite to the semiconductor layer 210 inside the semiconductor layer 210 on the bottom of the trenches 218, 220, and 222 provided in the semiconductor layer 210 (FIG. 7B). In the present embodiment, since the semiconductor layer 210 is assumed to be of the n-type, the semiconductor region 224 is of the p-type. The semiconductor region 224 reaches at least the depth corresponding to the thickness T of the thinned semiconductor layer 210. When the depth D1 of the trenches 218 and 220 is 2.6 μm, the width in the depth direction of the semiconductor region 224 can be set to around 0.4 μm to 0.7 μm, for example.

Figure 7C:
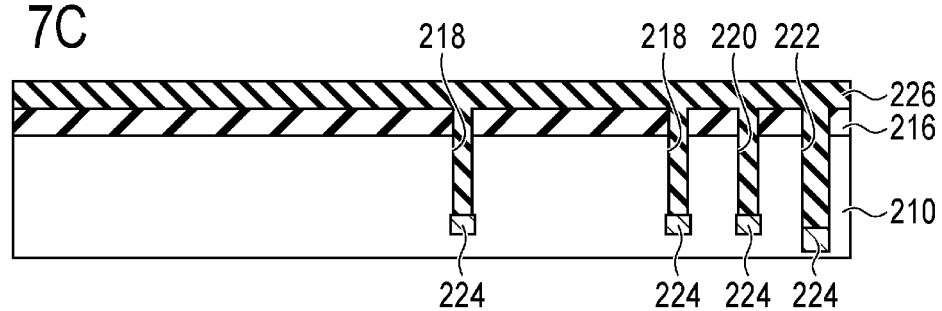

Next, an insulating film 226 is formed on the whole surface on the insulating film 216 side including the inside of the trenches 218, 220, and 222 by a CVD method, for example (FIG. 7C). For the material forming the insulating film 226, any material can be selected from insulating materials that are generally used for semiconductor apparatuses. For example, a silicon oxide film, a silicon nitride film, a silicon oxy-nitride film, or the like can be applied for the insulating film 226.

Figure 7D:
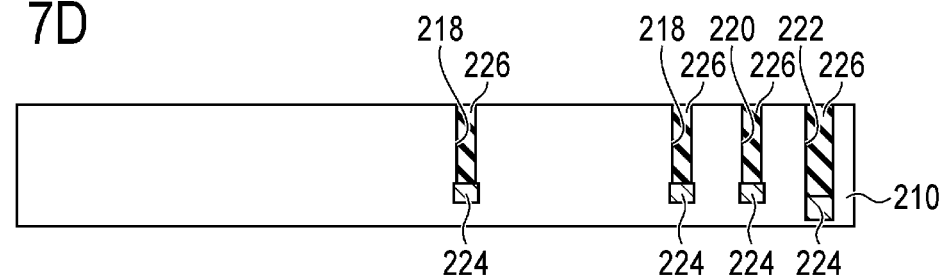

Next, the insulating film 226 on the insulating film 216 and the insulating film 216 are sequentially removed so that at least the insulating film 226 embedded in the trenches 218, 220, and 222 of the semiconductor layer 210 remains (FIG. 7D). A CMP method, wet etching, dry etching, or the like can be applied for the removal of the insulating film 226 and the insulating film 216.

Figure 7E:
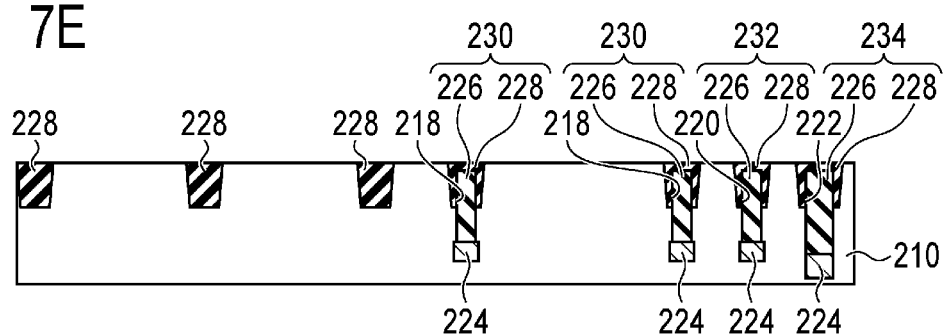

Next, the insulator portion 228 is formed on the surface of the semiconductor layer 210 on the first face 212 side by the STI method or the like, for example. The insulator portion 228 is formed in a region overlapping the trenches 218, 220, and 222 in plan view in addition to forming an element isolation portion that defines an active region in the first face 212 of the semiconductor layer 210. Thereby, the insulator portion 230 formed of the insulating film 226 and the insulator portion 228 is formed in a portion in which the trench 218 is provided. Further, the insulator portion 232 formed of the insulating film 226 and the insulator portion 228 is formed in a portion in which the trench 220 is provided. Further, the insulator member 234 formed of the insulating film 226 and the insulator portion 228 is formed in a portion in which the trench 222 is provided (FIG. 7E).

Figure 7F:
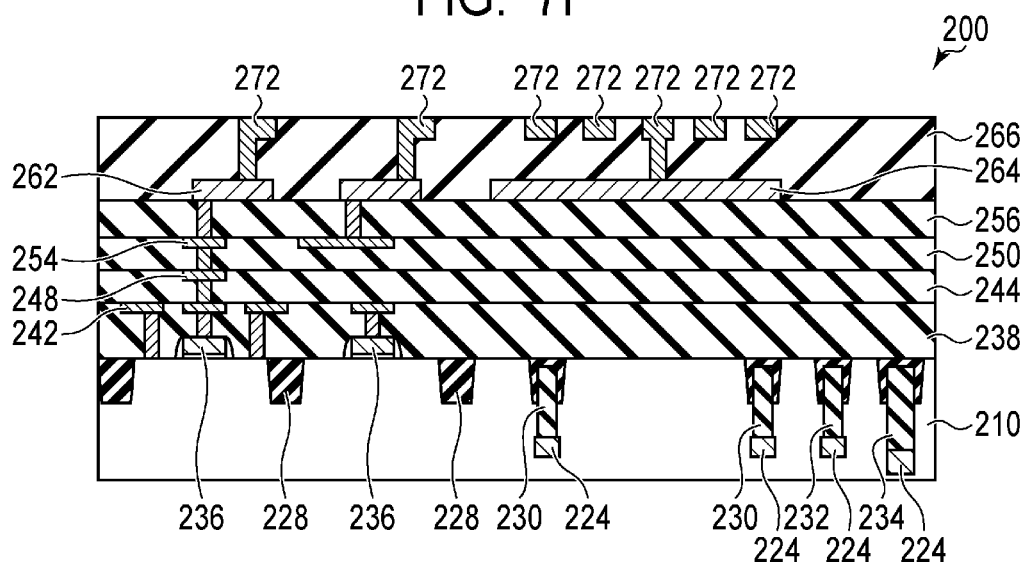

Next, the gate electrode 236, the interlayer insulating films 238, 244, 250, 256, and 266, the interconnection layers 242, 248, 254, 262, and 272, the external connection electrode 264, and the like are formed in the same manner as in the manufacturing method of the first embodiment illustrated in FIG. 4F to FIG. 4J (FIG. 7F). In such a way, the second component 200 before bonded is completed.

Figure 7G:
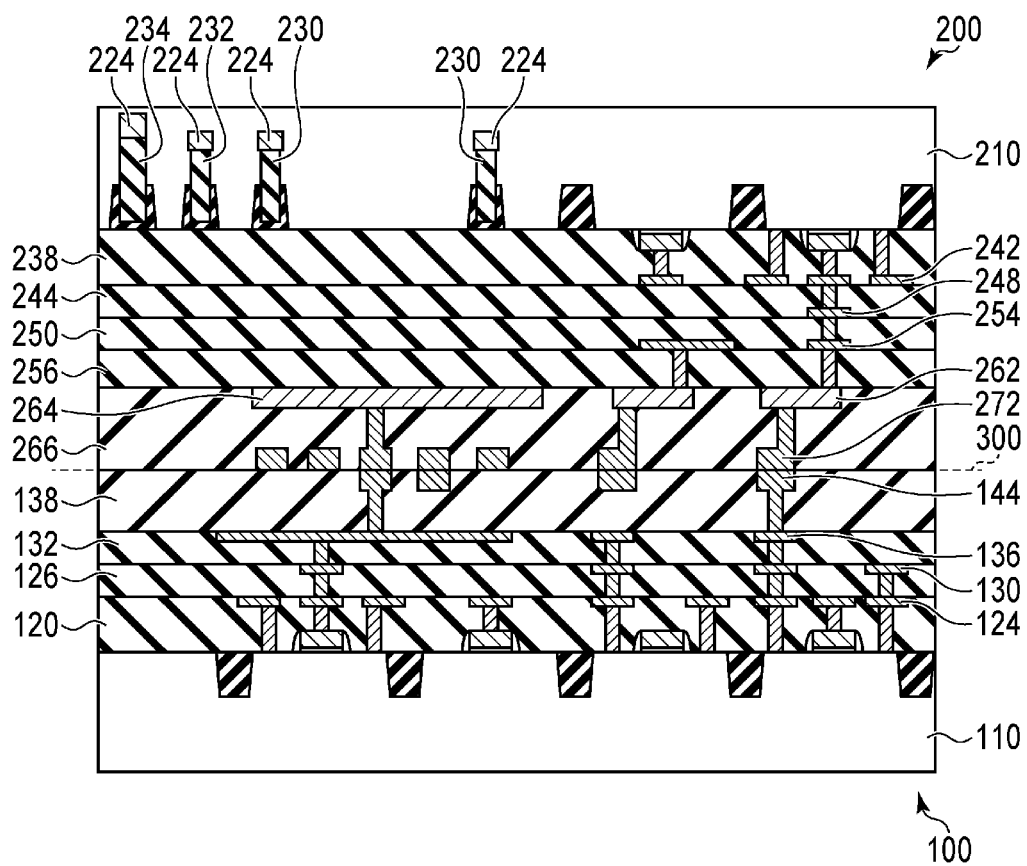

Next, the first component 100 and the second component 200 as formed described above are arranged so that the face on the interlayer insulating film 138 side faces the face on the interlayer insulating film 266 side and are bonded. Thereby, the interconnection 144 of the first component 100 and the interconnection 272 of the second component 200 are electrically connected at the junction plane 300 between the first component 100 and the second component 200 (FIG. 7G).

Figure 7H:
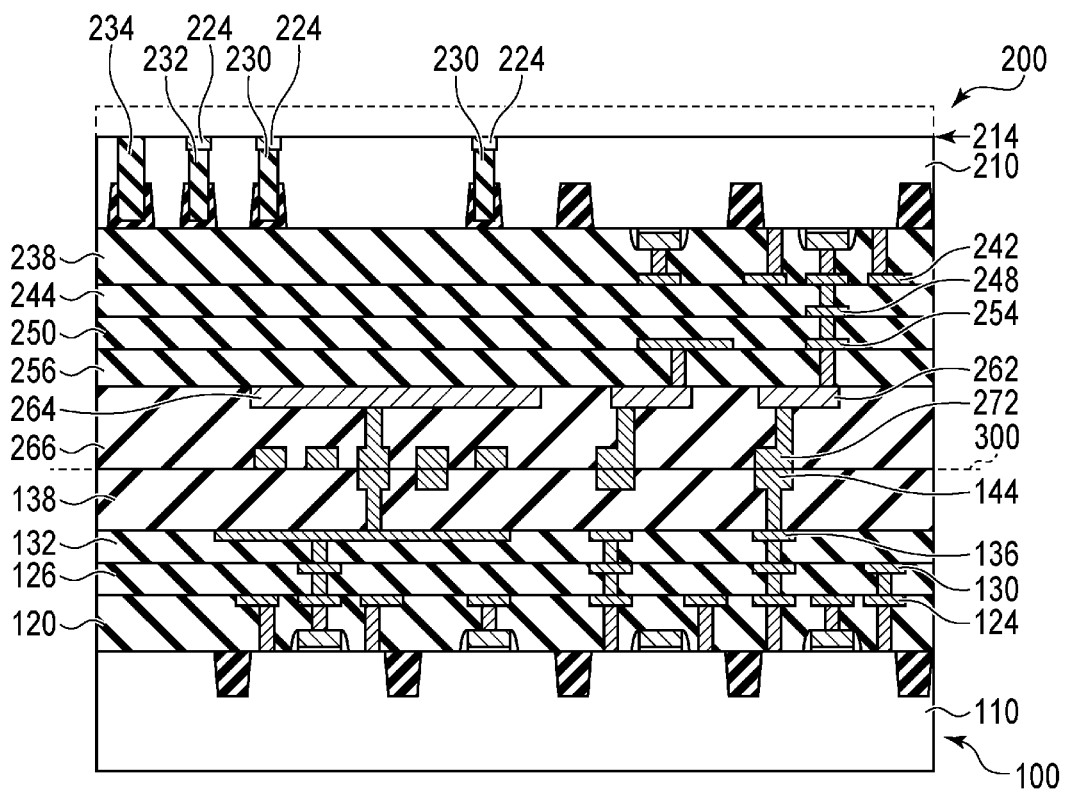

Next, the semiconductor layer 210 of the second component 200 is thinned from the second face 214 side to the degree that the insulator member 234 is exposed (FIG. 7H). A method such as back grind, CMP, etching, or the like can be applied for the thinning of the semiconductor layer 210.

At this time, since the trenches 218 and 220 in which the insulator portions 230 and 232 are provided are shallower than the trench 222 in which the insulator member 234 is provided, while the insulator portions 230 and 232 are not exposed on the second face 214 side, the semiconductor region 224 in contact with the insulator portions 230 and 232 is exposed on the second face 214 side. Further, since the insulator portions 230 and 232 are not exposed on the second face 214 side when the semiconductor layer 210 is thinned, local stress concentration in a process of thinning the semiconductor layer 210 can be suppressed, and occurrence of a chipping, a crack, or the like can be prevented.

Figure 7I:
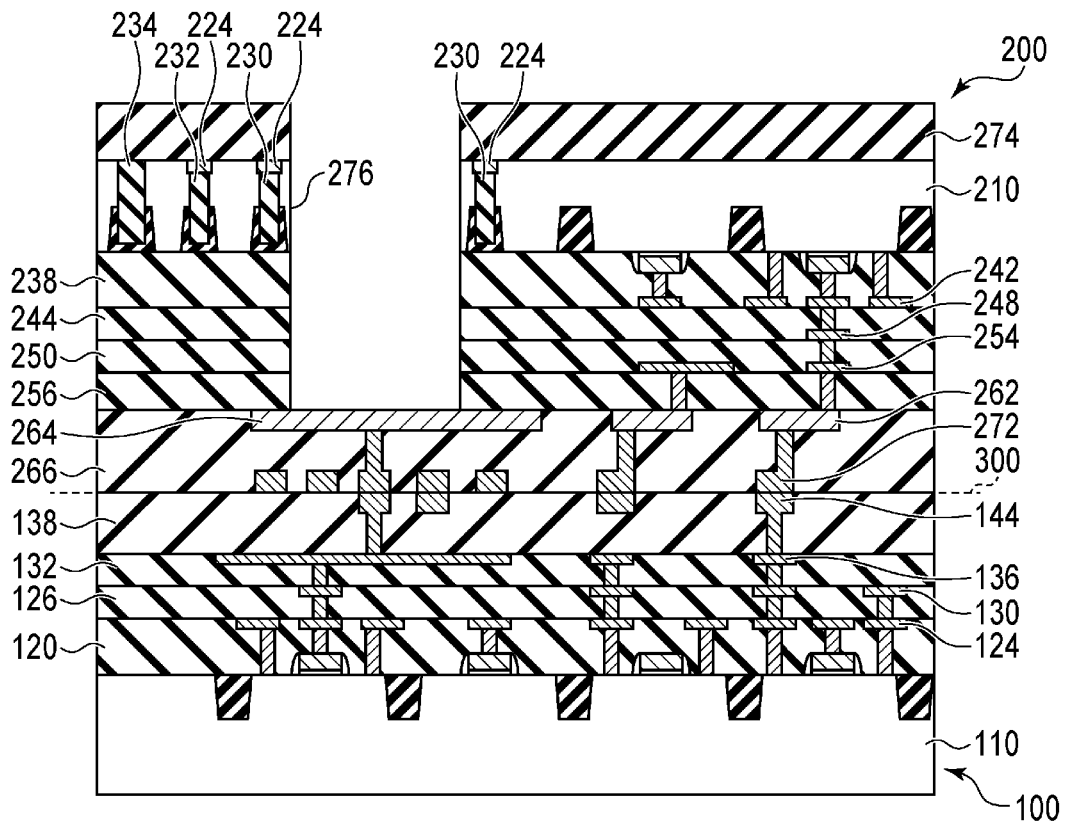

Next, the structure 274 and the opening 276 are formed in the same manner as in the manufacturing method in the first embodiment illustrated in FIG. 5B and FIG. 5C (FIG. 7I).

At this time, since the insulator member 234 is exposed on the second face 214 side of the semiconductor layer 210 and has good visibility in the semiconductor manufacturing apparatus, the insulator member 234 can be utilized as a mark for alignment (the alignment mark 16). That is, while it is necessary to align various structures in the structure 274 or the opening 276 with respect to the semiconductor layer 210 when manufactured by a semiconductor manufacturing apparatus, it is possible to utilize the insulator member 234 as the alignment mark 16 in the present embodiment. Accordingly, it is possible to form the structure 274 and the opening 276 while ensuring alignment accuracy to the underlying structure.

Then, the bonded body of the first component 100 and the second component 200 is diced and divided into individual semiconductor chips.

Next, each of the plurality of semiconductor chips diced into pieces is bonded to a support member (not illustrated) such as a package substrate or a lead frame.

Figure 7J:
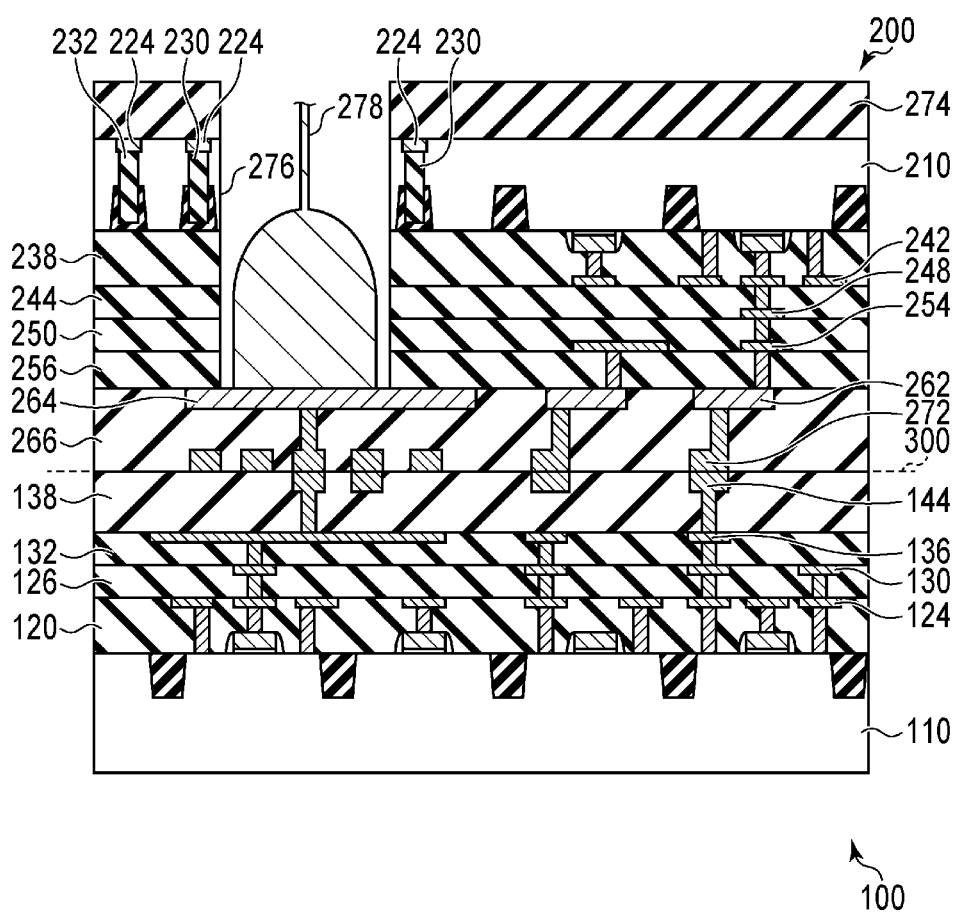

Next, the external connection electrode 264 exposed in the opening 276 and an external terminal provided on the support member are connected to each other by the wire 278 by wire bonding (FIG. 7J).

As described above, in the present embodiment, the semiconductor region 224 of a different conductivity type from the semiconductor layer 210 is connected to the insulator portion 230 surrounding the opening 276 exposing the external connection electrode 264, and thereby insulation of the opening 276 is ensured. Therefore, according to the present embodiment, it is possible to avoid stress concentration in the insulator portion 230 in a substrate thinning process and prevent a defect or a crack of the semiconductor layer 210. Accordingly, it is possible to ensure insulation performance of the opening 276 used for the external connection electrode 264 without reducing the fabrication yield of semiconductor apparatuses.

Further, in the present embodiment, the configuration of the insulator portion 232 surrounding the semiconductor chip region 10 is the same as that of the insulator portion 230 surrounding the opening 276. Accordingly, it is possible to avoid stress concentration in the insulator portion 232 in a substrate thinning process and prevent a defect or a crack of the semiconductor layer 210.

Further, in the present embodiment, the alignment mark 16 arranged in the scribe region 12 is formed of the insulator member 234. While having the DTI structure formed at the same time as the insulator portions 230 and 232, the insulator member is configured to penetrate the semiconductor layer 210, and detectability of the insulator member as the alignment mark 16 can be ensured.

Third Embodiment

A semiconductor apparatus and a method of manufacturing the same according to a third embodiment of the present invention will be described with reference to FIG. 8 to FIG. 9J. The same components as those of the semiconductor apparatus according to the first and second embodiments are labeled with the same references, and the description thereof will be omitted or simplified.

First, a general configuration of the semiconductor apparatus according to the present embodiment will be described with reference to FIG. 8. FIG. 8 is a schematic cross-sectional view of the semiconductor apparatus according to the present embodiment. FIG. 8 is a cross-sectional view taken along the line B-B' of FIG. 1.

Figure 8:
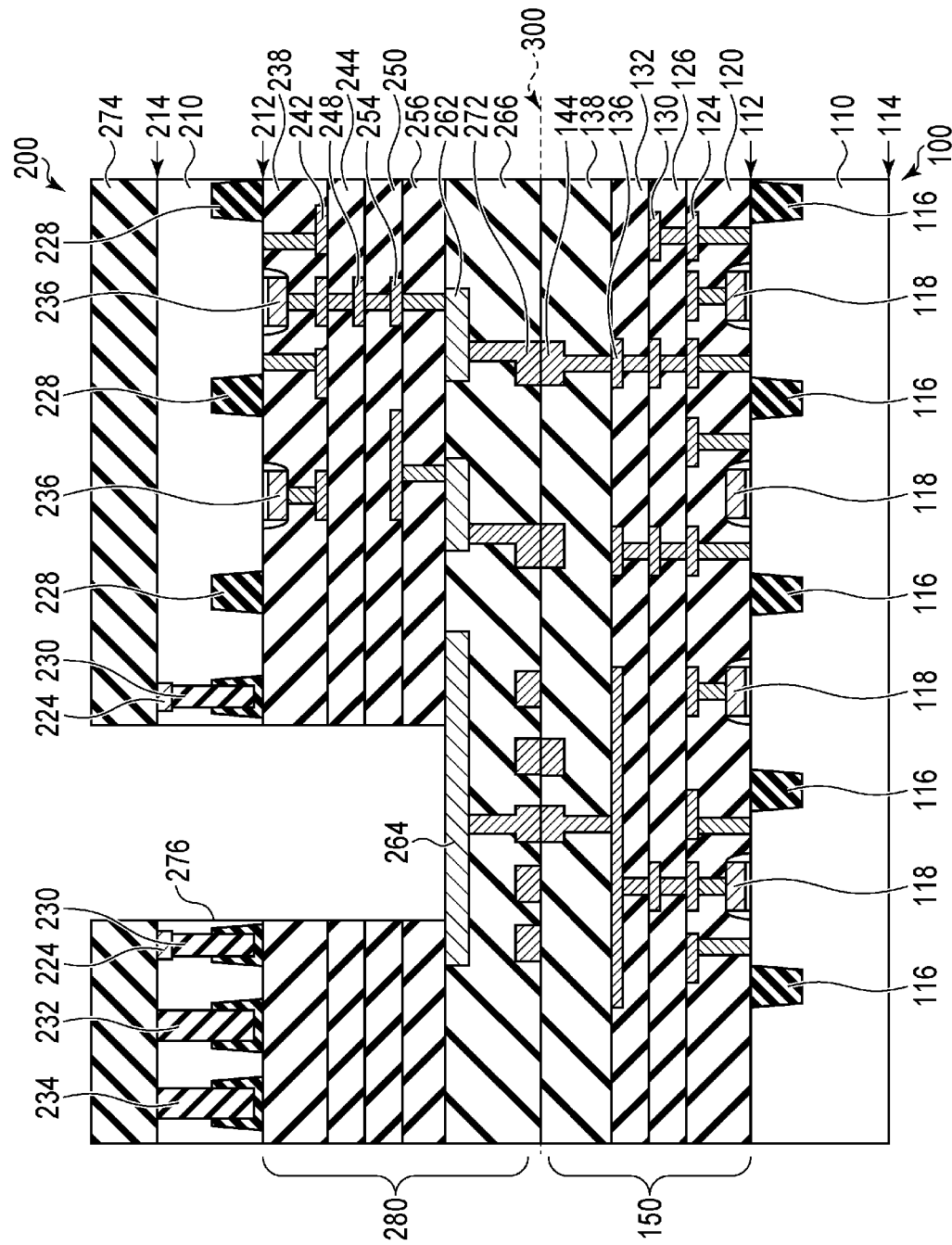
FIG. 8 is a schematic cross-sectional view of a semiconductor apparatus according to a third embodiment of the present invention.

As illustrated in FIG. 8, in the semiconductor apparatus according to the present embodiment, the frame-shaped insulator portion 232 provided along the circumference of the semiconductor chip region 10 has the same structure as the insulator member 234 forming the alignment mark 16. That is, the insulator portion 232 is provided so as to penetrate the semiconductor layer 210 as with the insulator member 234. Other features are the same as those of the semiconductor apparatus according to the second embodiment. Note that each width of the insulator portion 232 and the insulator member 234 at the depth of T/2 of the semiconductor layer 210 from the first face 212 is wider than the width of the insulator portion 230 at the depth of T/2 of the semiconductor layer 210 from the first face 212.

Next, the method of manufacturing the semiconductor apparatus according to the present embodiment will be described with reference to FIG. 9A to FIG. 9J. FIG. 9A to FIG. 9J are cross-sectional views illustrating the method of manufacturing the semiconductor apparatus according to the present embodiment.

First, the first component 100 before bonded is manufactured in the same manner as in the manufacturing method of the first embodiment illustrated in FIG. 3A to FIG. 3C.

Further, the semiconductor layer 210 is prepared as the base material of the second component 200 independently of the first component 100. The semiconductor layer 210 is a silicon substrate, for example, and has the first face 212 and the second face 214 that are a pair of opposed surfaces. While the conductivity type of the semiconductor layer 210 may be any of the n-type or the p-type, the n-type semiconductor layer 210 is assumed here for illustration.

Next, the insulating film 216 having a film thickness of around 0.5 μm to 1.0 μm, for example, is formed on the first face 212 of the semiconductor layer 210 by a CVD method, for example. For the material forming the insulating film 216, any material can be selected from insulating materials that are generally used for semiconductor apparatuses. For example, a silicon oxide film, a silicon nitride film, or the like can be applied for the insulating film 216. The insulating film 216 may be of single-layer structure or layered structure combining the materials described above.

Figure 9A:
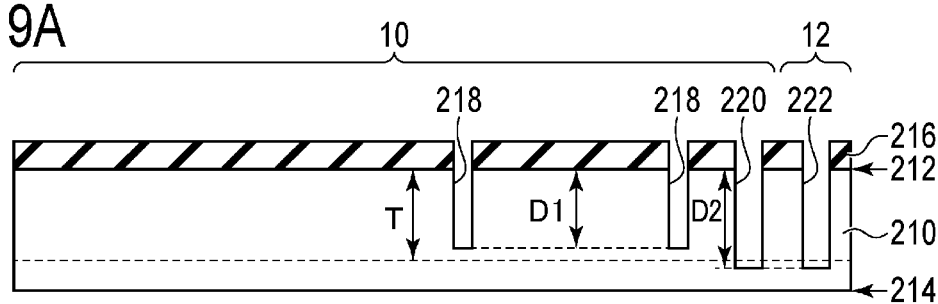
FIG. 9A, FIG. 9B, FIG. 9C, FIG. 9D, FIG. 9E, FIG. 9F, FIG. 9G, FIG. 9H, FIG. 9I, and FIG. 9J are cross-sectional views illustrating a method of manufacturing the semiconductor apparatus according to the third embodiment of the present invention.

Next, the insulating film 216 and the semiconductor layer 210 are patterned by using photolithography and dry etching to form trenches 218, 220, and 222 in the insulating film 216 and the semiconductor layer 210 (FIG. 9A). The trench 218 is provided in a frame-shaped region along the circumference of a region in which the external connection electrode 264 is to be provided in the later process. The trench 220 is provided in a frame-shaped region along the circumference of the semiconductor chip region 10. The trench 222 is a trench used for forming the alignment mark 16 and is provided in the scribe region 12.

Herein, the depth D1 of the trench 218 from the first face 212 is set in a range of T/2<D1<T, where the thickness of the thinned semiconductor layer 210 is T. Further, the depth D2 of the trenches 220 and 222 from the first face 212 is set in a range of T≤D2. For example, when the thickness T of the thinned semiconductor layer 210 is 3.0 μm, the depth D1 of the trench 218 can be set to around 2.6 μm, and the depth D2 of the trenches 220 and 222 can be set to around 3.0 μm or larger.

Although the trench 218 and the trenches 220 and 222 having different depths may be individually formed, these trenches can be formed at the same time by using a micro-loading effect during dry etching. That is, with each width of the trenches 220 and 222 being set wider than the width of the trench 218, the etching rate of the portion of the trenches 220 and 222 can be higher than the etching rate of the portions of the trench 218 due to a micro-loading effect during dry etching. Therefore, by appropriately setting each width of the trenches 220 and 222 and the width of the trench 218 in accordance with etching conditions, respectively, it is possible to set the depth D1 of the trench 218 and the depth D2 of the trenches 220 and 222 to meet the relationship described above.

Note that the depth D2 of the trench 220 and the depth D2 of the trench 222 from the first face 212 each satisfy the relationship of T D2 and are not necessarily required to be the same. Further, the width of the trench 220 and the width of the trench 222 are not necessarily required to be the same.

Figure 9B:
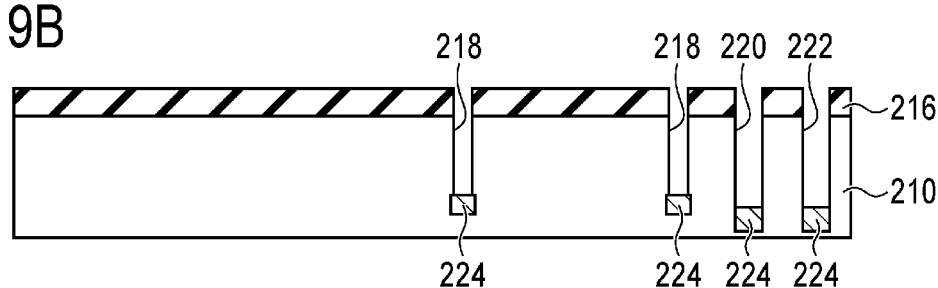

Next, the insulating film 216 is used as a mask to introduce an impurity to the semiconductor layer 210 by ion implantation and form the semiconductor region 224 of the conductivity type opposite to the semiconductor layer 210 inside the semiconductor layer 210 on the bottom of the trenches 218, 220, and 222 provided in the semiconductor layer 210 (FIG. 9B). In the present embodiment, since the semiconductor layer 210 is assumed to be of the n-type, the semiconductor region 224 is of the p-type. The semiconductor region 224 reaches at least the depth corresponding to the thickness T of the thinned semiconductor layer 210. When the depth D1 of the trench 218 is 2.6 μm, the width in the depth direction of the semiconductor region 224 can be set to around 0.4 μm to 0.7 μm, for example.

Figure 9C:
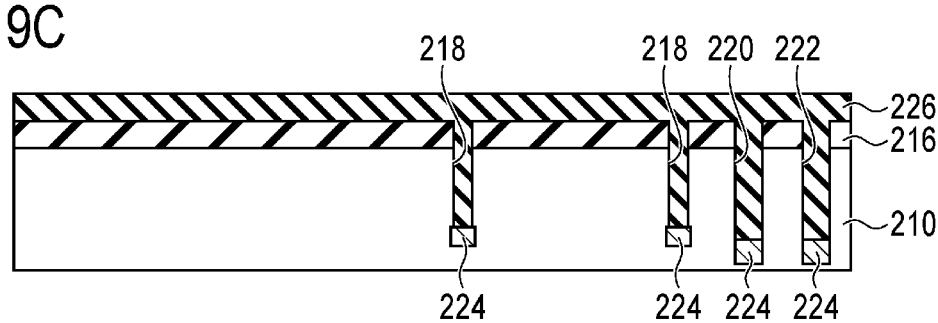

Next, an insulating film 226 is formed on the whole surface on the insulating film 216 side including the inside of the trenches 218, 220, and 222 by a CVD method, for example (FIG. 9C). For the material forming the insulating film 226, any material can be selected from insulating materials that are generally used for semiconductor apparatuses. For example, a silicon oxide film, a silicon nitride film, a silicon oxy-nitride film, or the like can be applied for the insulating film 226.

Figure 9D:
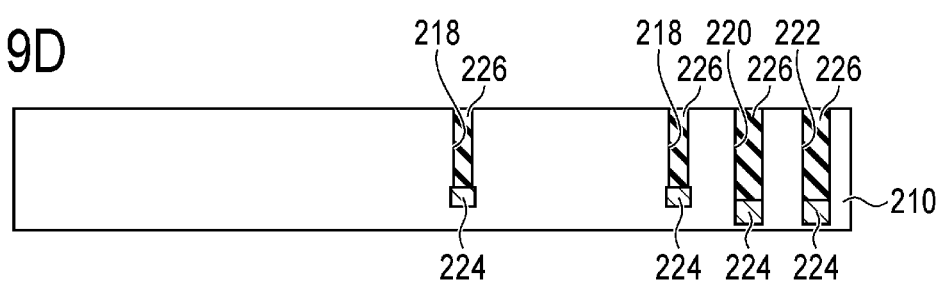

Next, the insulating film 226 on the insulating film 216 and the insulating film 216 are sequentially removed so that at least the insulating film 226 embedded in the trenches 218, 220, and 222 of the semiconductor layer 210 remains (FIG. 9D). A CMP method, wet etching, dry etching, or the like can be applied for the removal of the insulating film 226 and the insulating film 216.

Figure 9E:
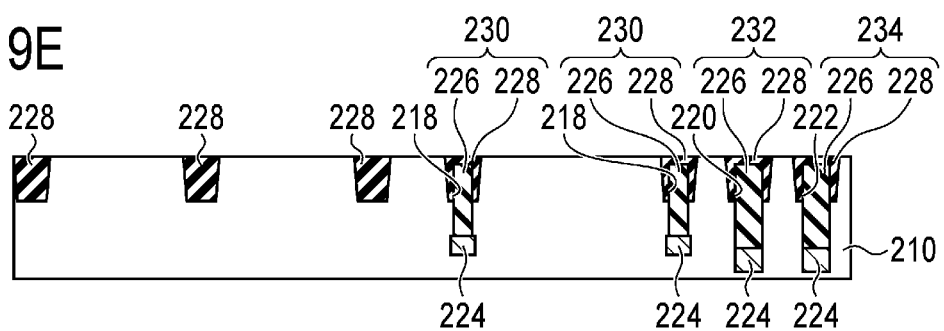

Next, the insulator portion 228 is formed on the surface of the semiconductor layer 210 on the first face 212 side by the STI method or the like, for example. The insulator portion 228 is formed in a region overlapping the trenches 218, 220, and 222 in a plan view in addition to forming an element isolation portion that defines an active region in the first face 212 of the semiconductor layer 210. Thereby, the insulator portion 230 formed of the insulating film 226 and the insulator portion 228 is formed in a portion in which the trench 218 is provided. Further, the insulator portion 232 formed of the insulating film 226 and the insulator portion 228 is formed in a portion in which the trench 220 is provided. Further, the insulator member 234 formed of the insulating film 226 and the insulator portion 228 is formed in a portion in which the trench 222 is provided (FIG. 9E).

Figure 9F:
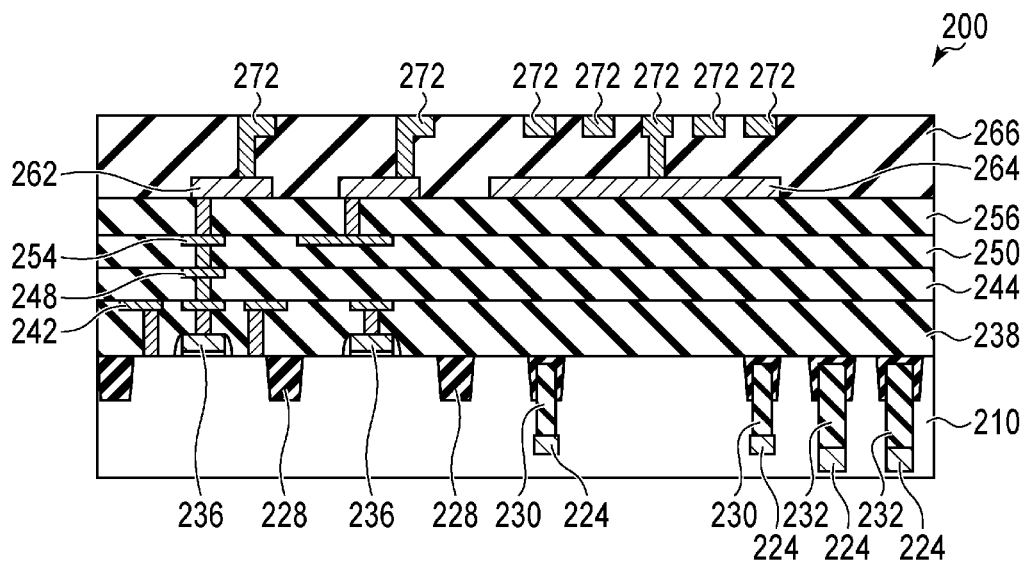

Next, the gate electrode 236, the interlayer insulating films 238, 244, 250, 256, and 266, the interconnection layers 242, 248, 254, 262, and 272, the external connection electrode 264, and the like are formed in the same manner as in the manufacturing method of the first embodiment illustrated in FIG. 4F to FIG. 4J (FIG. 9F). In such a way, the second component 200 before bonded is completed.

Figure 9G:
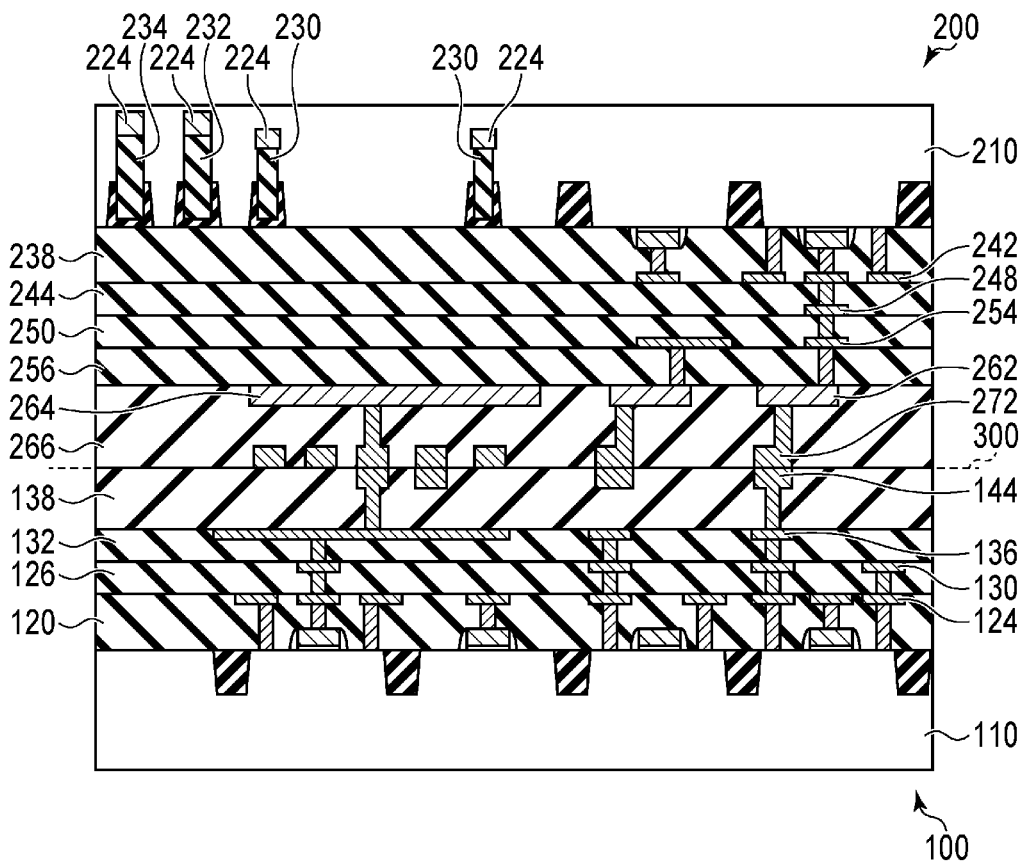

Next, the first component 100 and the second component 200 as formed described above are arranged so that the face on the interlayer insulating film 138 side faces the face on the interlayer insulating film 266 side and are bonded. Thereby, the interconnection 144 of the first component 100 and the interconnection 272 of the second component 200 are electrically connected at the junction plane 300 between the first component 100 and the second component 200 (FIG. 9G).

Figure 9H:
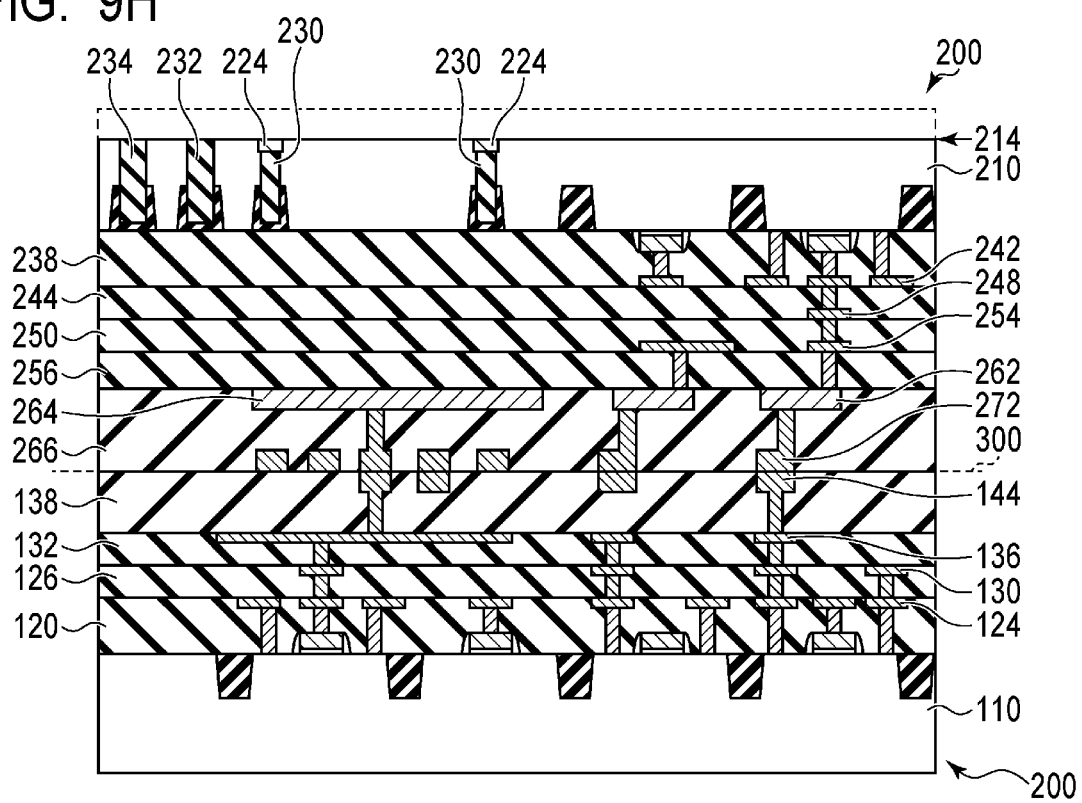

Next, the semiconductor layer 210 of the second component 200 is thinned from the second face 214 side to the degree that the insulator portion 232 and the insulator member 234 are exposed (FIG. 9H). A method such as back grind, CMP, etching, or the like can be applied for the thinning of the semiconductor layer 210.

At this time, since the trench 218 in which the insulator portion 230 is provided is shallower than the trenches 220 and 222 in which the insulator portion 232 and the insulator member 234 are provided, while the insulator portion 230 is not exposed on the second face 214 side, the semiconductor region 224 in contact with the insulator portion 230 is exposed on the second face 214 side. Further, since the insulator portion 230 is not exposed on the second face 214 side when the semiconductor layer 210 is thinned, local stress concentration in a process of thinning the semiconductor layer 210 can be suppressed, and occurrence of a chipping, a crack, or the like can be prevented.

Figure 9I:
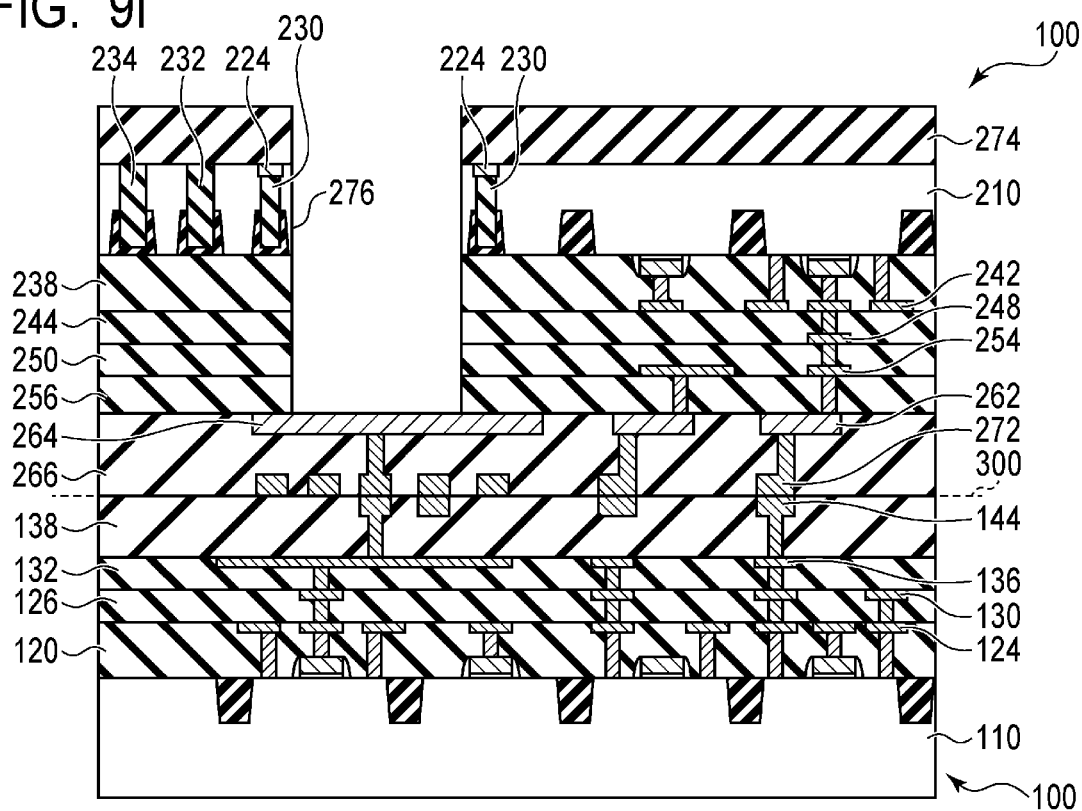

Next, the structure 274 and the opening 276 are formed in the same manner as in the manufacturing method in the first embodiment illustrated in FIG. 5B and FIG. 5C (FIG. 9I).

At this time, since the insulator member 234 is exposed on the second face 214 side of the semiconductor layer 210 and has good visibility in the semiconductor manufacturing apparatus, the insulator member 234 can be utilized as a mark for alignment (the alignment mark 16). That is, while it is necessary to align various structures in the structure 274 or the opening 276 with respect to the semiconductor layer 210 when manufactured by a semiconductor manufacturing apparatus, it is possible to utilize the insulator member 234 as the alignment mark 16 in the present embodiment. Accordingly, it is possible to form the structure 274 and the opening 276 while ensuring alignment accuracy to the underlying structure.

Then, the bonded body of the first component 100 and the second component 200 is diced and divided into individual semiconductor chips.

At this time, the semiconductor chip region 10 is surrounded by the insulator portion 232 penetrating the semiconductor layer 210. It is therefore possible to prevent a chipping or a crack from occurring in the semiconductor chip region 10 due to impact when the bonded body of the first component 100 and the second component 200 is diced.

Next, each of the plurality of semiconductor chips diced into pieces is bonded to a support member (not illustrated) such as a package substrate or a lead frame.

Figure 9J:
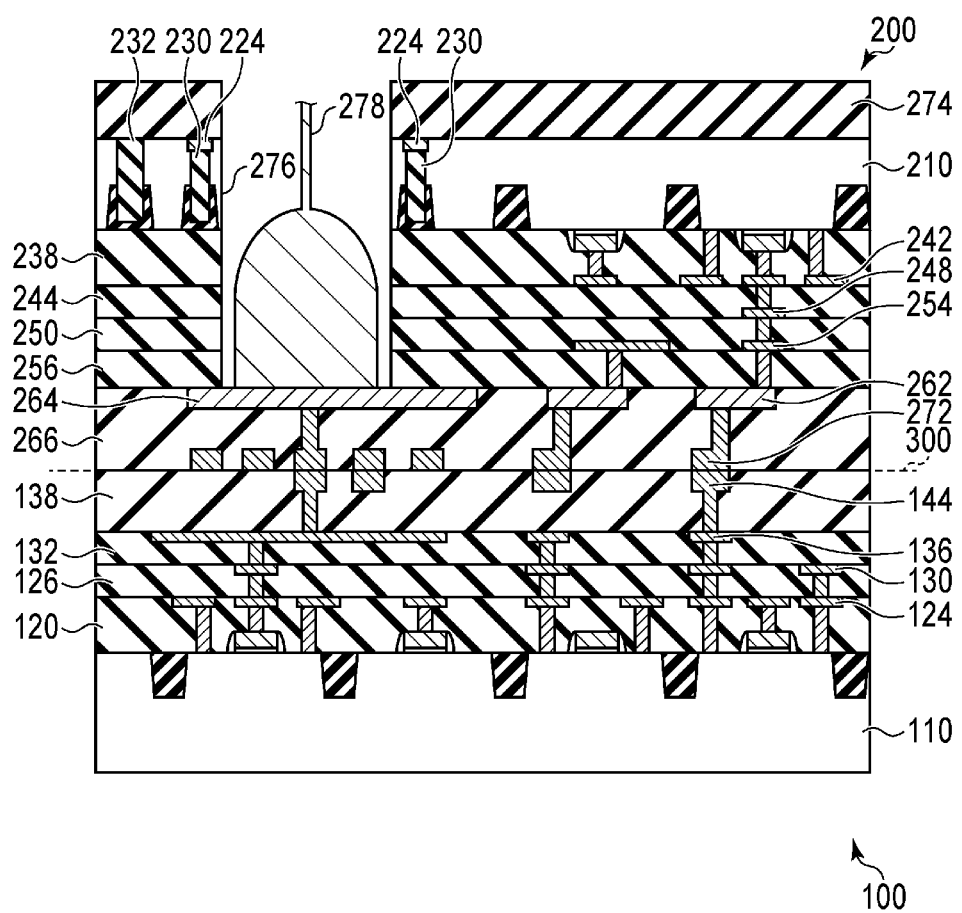

Next, the external connection electrode 264 exposed in the opening 276 and an external terminal provided on the support member are connected to each other by the wire 278 by wire bonding (FIG. 9J).

As described above, in the present embodiment, the semiconductor region 224 of a different conductivity type from the semiconductor layer 210 is connected to the insulator portion 230 surrounding the opening 276 exposing the external connection electrode 264, and thereby insulation of the opening 276 is ensured. Therefore, according to the present embodiment, it is possible to avoid stress concentration in the insulator portion 230 in a substrate thinning process and prevent a defect or a crack of the semiconductor layer 210. Accordingly, it is possible to ensure insulation performance of the opening 276 used for the external connection electrode 264 without reducing the fabrication yield of semiconductor apparatuses.

Further, in the present embodiment, since the insulator portion 232 surrounding the semiconductor chip region 10 is formed to penetrate the semiconductor layer 210, the semiconductor layer 210 in the semiconductor chip region 10 and the semiconductor layer 210 in the scribe region 12 can be completely isolated from each other. Accordingly, it is possible to prevent a defect or a crack of the semiconductor chip region 10 due to impact at dicing.

Further, in the present embodiment, the alignment mark 16 arranged in the scribe region 12 is formed of the insulator member 234. While having the DTI structure formed at the same time as the insulator portions 230 and 232, the insulator member is configured to penetrate the semiconductor layer 210, and detectability of the insulator member as the alignment mark 16 can be ensured.

Fourth Embodiment

Figure 10:
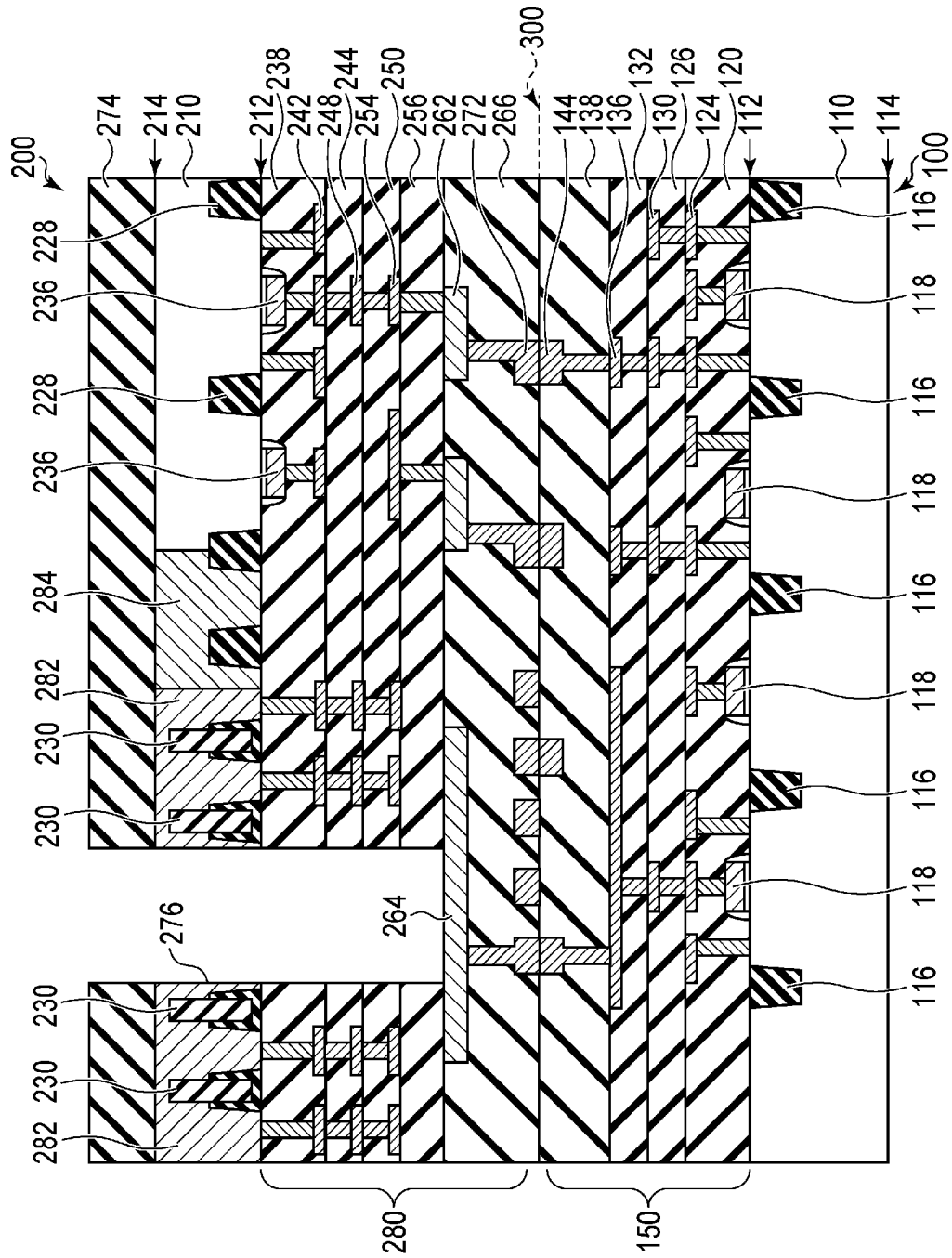
FIG. 10 is a schematic cross-view of a semiconductor apparatus according to a fourth embodiment of the present invention.

A semiconductor apparatus and a method of manufacturing the same according to a fourth embodiment of the present invention will be described with reference to FIG. 10. The same components as those of the semiconductor apparatus according to the first to third embodiments are labeled with the same references, and the description thereof will be omitted or simplified. FIG. 10 is a schematic cross-sectional view of the semiconductor apparatus according to the present embodiment.

In the semiconductor apparatus according to the present embodiment, as illustrated in FIG. 10, the insulator portions 230 provided so as to surround the opening 276 are arranged inside the semiconductor region 282 provided so as to extend from the first face 212 to the second face 214 of the semiconductor layer 210. Although each insulator portion 230 reaches the first face 212 of the semiconductor layer 210, each face of the insulator portions 230 on the second face 214 side does not reach the second face 214 and is in contact with the semiconductor region 282. The semiconductor region 224 is not provided on each face of the insulator portions 230 on the second face 214 side. Further, the semiconductor region 284 of the conductivity type opposite to the semiconductor region 224 provided around the semiconductor region 282 to extend from the first face 212 to the second face 214 of the semiconductor layer 210 is arranged so as to surround the semiconductor region 282. Also by forming the semiconductor apparatus in such a way, it is possible to electrically isolate the first region located on the opening 276 side and the second region located on the opposite side to the opening 276 from each other with respect to the p-n junction between the semiconductor region 282 and the semiconductor region 284.

Therefore, when a wiring is connected to the external connection electrode 264, even if this wiring contacts with the inner wall of the opening 276, the electrical insulation state with respect to another element or the like formed in the semiconductor layer 210 can be maintained by the insulator portions 230 and the semiconductor regions 282 and 284. Further, in the present embodiment, the double insulator portions 230 are provided so as to surround the opening 276, respectively. Accordingly, the electrical insulation state between a wiring connected to the external connection electrode 264 and another element or the like formed in the semiconductor layer 210 can be more suitably maintained. The insulator portion 230 surrounding the opening 276 may be further added.

The semiconductor region 282 may be, for example, a part of a semiconductor substrate having a predetermined conductivity type or an epitaxial layer of a predetermined conductivity type grown on a semiconductor substrate. Further, the semiconductor region 284 may be a semiconductor region of the opposite conductivity type formed by ion implantation in a part of the semiconductor substrate or the epitaxial layer. For example, the semiconductor region 282 is the n-type semiconductor region, and the semiconductor region 284 is a P-type semiconductor region.

Note that the semiconductor region 282 may be one example of the semiconductor region provided in the semiconductor layer 210 so as to extend from the face of the insulator portion 230 on the second face 214 side to the second face 214 in a direction perpendicular to the second face 214. Further, the semiconductor region 284 may be one example of the semiconductor region provided on the opposite side to the opening 276 with respect to the insulator portion 230 within a virtual plane along the second face 214.

Further, although the semiconductor region 224 is not provided on the face of the insulator portion 230 on the second face 214 side in the present embodiment, the semiconductor region 224 may be provided as with the first to third embodiments.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is also one of the embodiments of the present invention.

Further, although the external connection electrode 264 is formed of the fourth interconnection layer on the second component 200 side in the above embodiments, the external connection electrode 264 may be formed of another interconnection layer forming the interconnection structure 280. Further, the external connection electrode 264 is not necessarily required to be formed of an interconnection layer on the second component 200 side but may be formed of any interconnection layer forming the interconnection structure 150 on the first component 100 side.

Further, although the case where the alignment mark 16 arranged in the scribe region 12 is removed by dicing the semiconductor wafer has been illustrated as an example in the above embodiments, the alignment mark 16 may remain after the semiconductor wafer is diced into pieces.

Further, the configuration of the semiconductor apparatus described in any of the above embodiments is not particularly limited and is applicable to various semiconductor devices such as a logic device, a memory device, an imaging device, or the like. Further, the semiconductor apparatus described in any of the above embodiments is applicable to various electronic apparatuses. The electronic apparatus is not particularly limited and may be, for example, a digital still camera, a video camera, a smartphone, a personal computer, a home appliance (IoT), or the like.

Further, the semiconductor apparatus described in any of the above embodiments can also be applied to a transport apparatus having a moving apparatus. For example, the transport apparatus may have a control apparatus that controls the moving apparatus based on a signal output from the semiconductor apparatus described in any of the above embodiments. For example, when the semiconductor apparatus is a solid-state imaging apparatus, the semiconductor apparatus can be configured to calculate a distance to an object or the like based on a signal output from the photoelectric conversion element and control a moving apparatus based on the calculated distance or the like. The moving apparatus is not particularly limited and may be, for example, a motive power source or a driving mechanism such as an engine, a motor, a wheel, a propeller, or the like. The transport apparatus is not particularly limited and may be, for example, an airplane, a vehicle, a ship, or the like.

These apparatuses may include the semiconductor apparatus described in any of the above embodiments and a signal processing apparatus that processes a signal output from the semiconductor apparatus.

Further, each term in the present specification is solely used for the purpose of illustration of the present invention and may include the equivalent thereof, and the present invention is not limited to a strict sense of the term.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-086104, filed Apr. 26, 2019 which is hereby incorporated by reference herein in its entirety.

What is claimed is:

1. A semiconductor apparatus comprising:
a semiconductor layer having a first face and a second face opposite to the first face; and an interconnection structure provided on the first face side of the semiconductor layer; and
an insulator portion arranged in a trench of the semiconductor layer,
wherein the semiconductor layer is provided with a semiconductor element portion in which a plurality of semiconductor elements are provided, and the semiconductor layer is provided with a plurality of openings each penetrating the semiconductor layer,
wherein the insulator portion is provided so as to surround at least one opening of the plurality of openings within a virtual plane along the second face, and the insulator portion extends to a depth in the semiconductor layer, the depth is larger than T/2 from the first face of the semiconductor layer, and the depth is smaller than T from the first face of the semiconductor layer, where T is a thickness of the semiconductor layer,
wherein the semiconductor layer includes,
a first semiconductor region of a first conductivity type provided on the opposite side to the one opening with respect to the insulator portion within the virtual plane, and
a second semiconductor region of a second conductivity type provided in the semiconductor layer so as to extend from a face of the insulator portion on the second face side to the second face in a direction perpendicular to the second face.

2. The semiconductor apparatus according to claim 1, wherein the semiconductor layer includes a third semiconductor region of the first conductivity type provided between the insulator portion and the one opening within the virtual plane.

3. The semiconductor apparatus according to claim 1, wherein the insulator portion includes a first insulator portion located between the one opening and the semiconductor element portion.

4. The semiconductor apparatus according to claim 3, wherein the first insulator portion is located between an opening of the plurality of openings that is different from the one opening and the one opening.

5. The semiconductor apparatus according to claim 1,
wherein the insulator portion includes a second insulator portion provided so as to surround the plurality of openings and the semiconductor element portion within the virtual plane, and
wherein semiconductor layer includes a semiconductor region of the second conductivity type provided in the semiconductor layer so as to extend from a face of the second insulator portion on the second face side to the second face.

6. The semiconductor apparatus according to claim 1,
wherein the insulator portion includes
a first insulator portion located between the one opening and the semiconductor element portion, and
a second insulator portion located between an end face of the semiconductor layer and the first insulator portion,
wherein a width of the second insulator portion at a depth of T/2 from the first face is wider than a width of the first insulator portion at a depth of T/2 from the first face.

7. The semiconductor apparatus according to claim 1 further comprising an insulator member provided so as to extend from the first face to the second face of the semiconductor layer.

8. The semiconductor apparatus according to claim 7, wherein a width of the insulator member at a depth of T/2 from the first face is wider than a width of the insulator portion at a depth of T/2 from the first face.

9. The semiconductor apparatus according to claim 1, wherein the insulator portion is provided so as to extend to a depth that is larger than or equal to T×¾ and smaller than T from the first face of the semiconductor layer.

10. The semiconductor apparatus according to claim 1 further comprising a conductor member provided inside the opening.

11. The semiconductor apparatus according to claim 10, wherein the interconnection structure includes an electrode connected to the conductor member.

12. The semiconductor apparatus according to claim 1 further comprising a substrate, wherein the interconnection structure is located between the semiconductor layer and the substrate.

13. The semiconductor apparatus according to claim 12, wherein the interconnection structure includes a first interconnection structure including an interconnection connected to the semiconductor layer and a second interconnection structure including an interconnection connected to the substrate.

14. The semiconductor apparatus according to claim 13 further comprising a conductor member provided inside the opening,
wherein an electrode connected to the conductor member is provided in the first interconnection structure.

15. The semiconductor apparatus according to claim 13 further comprising a conductor member provided inside the opening,
wherein an electrode connected to the conductor member is provided in the second interconnection structure.

16. The semiconductor apparatus according to claim 1 further comprising an optical structure provided on the second face side of the semiconductor layer.

17. The semiconductor apparatus according to claim 1 further comprising an element isolation portion formed of an insulator so as to extend to a depth that is smaller than T/2 from the first face of the semiconductor layer and provided in the semiconductor element portion.

18. The semiconductor apparatus according to claim 1, wherein a plurality of photoelectric conversion elements are arranged in the semiconductor element portion.

19. The semiconductor apparatus according to claim 1, wherein the second semiconductor region is provided so as to extend from the first face to the second face of the semiconductor layer.

20. An equipment comprising:
the semiconductor apparatus according to claim 1; and
a signal processing apparatus that processes a signal output from the semiconductor apparatus.

* * * * *